United States Patent
Luan et al.

(10) Patent No.: US 11,462,686 B2
(45) Date of Patent: Oct. 4, 2022

(54) THREE-DIMENSIONAL ARRAY ARCHITECTURE FOR RESISTIVE CHANGE ELEMENT ARRAYS AND METHODS FOR MAKING SAME

(71) Applicant: Nantero, Inc., Woburn, MA (US)

(72) Inventors: Harry Shengwen Luan, Saratoga, CA (US); Thomas Rueckes, Byfield, MA (US)

(73) Assignee: Nantero, Inc., Woburn, MA (US)

( * ) Notice: Subject to any disclaimer, the term of this patent is extended or adjusted under 35 U.S.C. 154(b) by 9 days.

(21) Appl. No.: 16/908,277

(22) Filed: Jun. 22, 2020

(65) Prior Publication Data
US 2021/0399219 A1 Dec. 23, 2021

(51) Int. Cl.
*H01L 45/00* (2006.01)
*H01L 27/24* (2006.01)

(52) U.S. Cl.
CPC ...... *H01L 45/1608* (2013.01); *H01L 27/2436* (2013.01); *H01L 45/1683* (2013.01)

(58) Field of Classification Search
CPC ............. H01L 45/1608; H01L 27/2418; H01L 27/2436; H01L 45/04; H01L 45/06
USPC ........................................................ 438/238
See application file for complete search history.

(56) References Cited

U.S. PATENT DOCUMENTS

| | | | |
|---|---|---|---|
| 6,534,403 B2 | 3/2003 | Cleeves | |
| 8,941,094 B2 | 1/2015 | Cleavelin et al. | |
| 9,018,047 B2 | 4/2015 | Lue | |
| 9,159,418 B1 | 10/2015 | Ward et al. | |
| 9,171,584 B2 | 10/2015 | Scheuerlein et al. | |
| 9,390,790 B2 | 7/2016 | Bertin et al. | |
| 9,691,821 B2 | 6/2017 | Bateman | |
| 10,256,275 B2 | 4/2019 | Liu | |
| 10,339,982 B2 | 7/2019 | Bertin et al. | |
| 2013/0043455 A1 | 2/2013 | Bateman | |
| 2013/0193395 A1* | 8/2013 | Lee | H01L 27/2436 257/4 |
| 2013/0210211 A1 | 8/2013 | Vereen et al. | |
| 2013/0240820 A1* | 9/2013 | Shin | H01L 45/06 257/3 |
| 2014/0048868 A1* | 2/2014 | Kim | H01L 29/7926 257/324 |

(Continued)

FOREIGN PATENT DOCUMENTS

TW 426590 2/2014

OTHER PUBLICATIONS

Steve Shih-Wei Wang, "3D NAND: Challenges Beyond 96-Layer Memory Arrays", Coventor, Oct. 12, 2018.

(Continued)

*Primary Examiner* — Didarul A Mazumder
(74) *Attorney, Agent, or Firm* — Nantero, Inc.

(57) ABSTRACT

A method to fabricate a resistive change element array may include depositing a resistive change material over a substrate and forming a first insulating material over the resistive change material. The method may also include etching a trench in the resistive change material and the first insulating material and forming a cavity in a sidewall of the trench by recessing the resistive change material. The method may further include flowing a conductive material in the cavity and depositing a second insulating material in the trench.

11 Claims, 29 Drawing Sheets

(56) References Cited

U.S. PATENT DOCUMENTS

| | | | | |
|---|---|---|---|---|
| 2014/0054538 | A1* | 2/2014 | Park | H01L 45/14 |
| | | | | 257/5 |
| 2015/0179705 | A1* | 6/2015 | Wouters | H01L 45/1608 |
| | | | | 257/5 |
| 2015/0340406 | A1* | 11/2015 | Jo | H01L 27/249 |
| | | | | 257/4 |
| 2016/0013127 | A1* | 1/2016 | Lai | H01L 21/32133 |
| | | | | 438/618 |
| 2016/0126455 | A1* | 5/2016 | Hayashi | H01L 45/1273 |
| | | | | 257/2 |
| 2018/0159030 | A1* | 6/2018 | Park | H01L 27/249 |
| 2020/0203429 | A1* | 6/2020 | Fantini | H01L 27/2481 |

OTHER PUBLICATIONS

Jagan Singh Meena, Simon Min Sze, Umesh Chand, Tseung-Yuen Tseng, "Overview of Emerging Nonvolatile Memory Technologies", Nanoscale Research Letters 9;526, 2014.

Chipworks Real Chips Blog, "Samsung's 3x DDR3 SDRAM—4F2 or 6F2? You Be the Judge." Solid State Technology, Siliconica, electroiq.com Jan. 31, 2011.

* cited by examiner

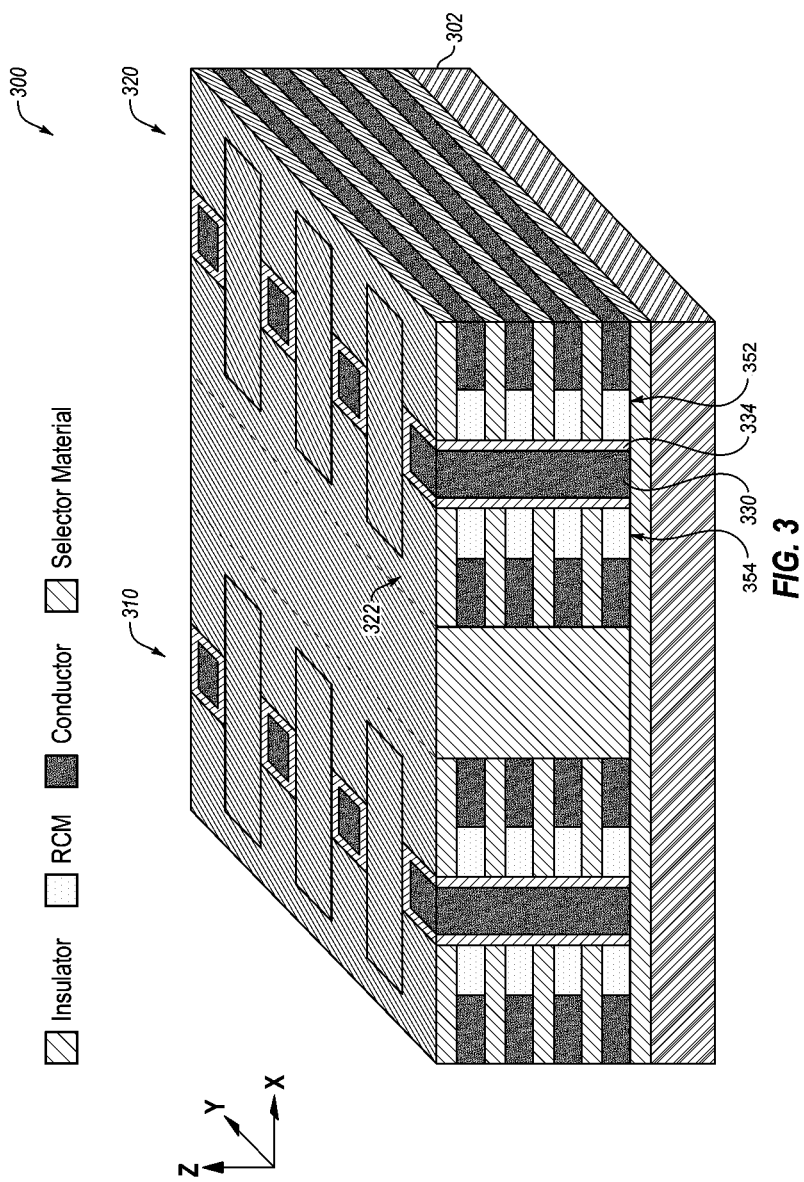

THREE-DIMENSIONAL ARRAY ARCHITECTURE FOR RESISTIVE CHANGE ELEMENT ARRAYS AND METHODS FOR MAKING SAME

CROSS-REFERENCE TO RELATED APPLICATIONS

The present disclosure relates generally to resistive change element array and, more specifically, to high density, three-dimensional arrays of resistive change elements.

U.S. Pat. No. 6,835,591, filed on Apr. 23, 2002, entitled Methods of Nanotube Films and Articles;

U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;

U.S. Pat. No. 6,706,402, filed on Mar. 16, 2004, entitled Nanotube Films and Articles;

U.S. Pat. No. 7,115,901, filed on Jun. 9, 2004, entitled Non-Volatile Electromechanical Field Effect Devices and Circuits Using Same and Methods of Forming Same;

U.S. Pat. No. 7,365,632, filed on Sep. 20, 2005, entitled Resistive Elements Using Carbon Nanotubes;

U.S. Pat. No. 7,781,862, filed on Nov. 15, 2005, entitled Two-Terminal Nanotube Devices and Systems and Methods of Making Same;

U.S. Pat. No. 7,479,654, filed on Nov. 15, 2005, entitled Memory Arrays Using Nanotube Articles with Reprogrammable Resistance;

U.S. Pat. No. 8,217,490, filed on Aug. 8, 2007, entitled Nonvolatile Nanotube Diodes and Nonvolatile Nanotube Blocks and Systems Using Same and Methods of Making Same;

U.S. Pat. No. 7,835,170, filed on Aug. 8, 2007, entitled Nonvolatile Nanotube Diodes and Nonvolatile Nanotube Blocks and Systems Using Same and Methods of Making Same;

U.S. Pat. No. 8,102,018, filed on Aug. 8, 2007, entitled Nonvolatile Resistive Memories Having Scalable Two-Terminal Nanotube Switches;

U.S. Pat. No. 9,287,356, filed on Jan. 20, 2009, entitled Nonvolatile Nanotube Diodes and Nonvolatile Nanotube Blocks and Systems Using Same and Methods of Making Same;

U.S. Pat. No. 8,319,205, filed on Aug. 6, 2009, entitled Nonvolatile Nanotube Programmable Logic Devices and a Nonvolatile Nanotube Field Programmable Gate Array Using Same;

U.S. Pat. No. 8,351,239, filed on Oct. 23, 2009, entitled Dynamic Sense Current Supply Circuit and Associated Method for Reading and Characterizing a Resistive Memory Array;

U.S. Pat. No. 8,000,127, filed on Nov. 13, 2009, entitled Method for Resetting a Resistive Change Memory Element;

U.S. Pat. No. 8,619,450, filed on Sep. 1, 2010, entitled A Method for Adjusting a Resistive Change Element Using a Reference;

U.S. Pat. No. 8,941,094, filed on Sep. 2, 2010, entitled Methods for Adjusting the Conductivity Range of a Nanotube Fabric Layer;

U.S. Pat. No. 9,617,151, filed on Feb. 14, 2011, entitled Methods for Controlling Density, Porosity, and/or Gap Size Within Nanotube Fabric Layers and Films;

U.S. Pat. No. 9,422,651, filed on Mar. 30, 2011, entitled Methods for Arranging Nanoscopic Elements Within Networks, Fabrics, and Films;

U.S. Pat. No. 9,390,790, filed on Dec. 17, 2012, entitled Carbon Based Nonvolatile Cross Point Memory Incorporating Carbon Based Diode Select Devices And MOSFET Select Devices For Memory And Logic Applications;

U.S. Pat. No. 9,337,423, filed on Feb. 27, 2015, entitled Two-Terminal Switching Device Using a Composite Material of Nanoscopic Particles and Carbon Nanotubes; and U.S. Pat. No. 9,947,400, filed on Apr. 22, 2016, entitled Methods for Enhanced State Retention Within a Resistive Change Cell.

This application is related to the following U.S. patent application Publications and U.S. patent application, which are assigned to the assignee of the application, and are hereby incorporated by reference in their entirety:

U.S. patent application Ser. No. 15/906,661, filed Feb. 27, 2018, entitled Resistive Change Element Cells Sharing Selection Devices;

U.S. patent application Ser. No. 16/434,813, filed Jun. 7, 2019, entitled Combinational Resistive Change Elements; and U.S. patent application Ser. No. 16/847,570, filed Apr. 13, 2020, entitled Sense Amplifiers.

TECHNICAL FIELD

The present disclosure relates generally to resistive change element array and, more specifically, to high density, three-dimensional arrays of resistive change elements.

BACKGROUND

Resistive change devices and arrays are well known in the semiconductor and electronics industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically including some material that may be adjusted between a number of non-volatile resistive states in response to some applied stimuli, within each individual array cell between two or more resistive states. As a result, the resistive change devices and arrays may be used in a variety of different devices, including memory devices, analog circuitry, and logic devices, among other types of devices.

Any discussion of the related art throughout this specification should in no way be considered as an admission that such art is widely known or forms part of the common general knowledge in the field. Additionally, the subject matter claimed herein is not limited to embodiments that solve any disadvantages or that operate only in environments such as those described above. Rather, this background is only provided to illustrate one example technology area where some embodiments described herein may be practiced.

SUMMARY

The present disclosure relates to a high density, three-dimensional array architecture for resistive change elements and methods for fabricating such arrays.

In particular, the present disclosure teaches a method to fabricate a resistive change element array may include depositing a resistive change material over a substrate and forming a first insulating material over the resistive change material. The method may also include etching a trench in the resistive change material and the first insulating material and forming a cavity in a sidewall of the trench by recessing the resistive change material. The method may further include flowing a conductive material in the cavity and depositing a second insulating material in the trench.

The present disclosure also teaches a method to fabricate a resistive change element array. This method first comprises depositing a resistive change material over a substrate and then forming a first insulating material over the resistive change material. This method further comprises depositing a second insulating material in a first trench in the resistive change material and the first insulating material. This method further comprises etching a second trench in the resistive change material and the first insulating material. This method further comprises forming a cavity in a sidewall of the second trench by recessing the resistive change material, the recessing of the resistive change material resulting in the resistive change material being divided into first and second portions separated by the second insulating material. Finally, this method comprises flowing a conductive material in the cavity that contacts the first and second portions of the resistive change material.

The present disclosure also teaches a method to fabricate a three-dimensional resistive change element array. This method first comprises depositing a first resistive change material over a substrate and forming a first insulating material over the first resistive change material. This method further comprises repeating the depositing and forming step to realize a plurality of resistive change materials separated by a plurality of insulating materials. This method further comprises etching a first trench through the plurality of resistive change materials and the plurality of insulating materials to form a three-dimensional array of resistive change material blocks, each of the resistive change material blocks having an exposed sidewall. This method further comprises etching a plurality of second trenches through the plurality of resistive change materials and the plurality of insulating materials in each resistive change material block, with the plurality of second trenches extending perpendicular to the first trench. This method further comprises depositing a second insulating material in the plurality of second trenches. This method further comprises recessing the sidewalls of the resistive change material blocks away from the trench to form cavities in the exposed sidewalls and expose the second insulating material in the plurality of second trenches such that the plurality of resistive change materials of each of the resistive change material blocks are electrically isolated from each other. This method further comprises flowing a first conductive material into the first trench and the cavities in electrical communication with the recessed sidewalls of the resistive change material blocks. This method further comprises partially removing the first conductive material such that (1) the first conductive material remains only within the cavities, (2) the resistive change material blocks are electrically isolated from each other, (3) the plurality of resistive change materials of each layer of said resistive change material blocks are in electrical communication, and (4) the plurality of resistive change materials of different layers of the resistive change material blocks are electrically isolated from each other. This method further comprises depositing a third insulating material in the first trench and, after depositing this third insulating material, forming a plurality of openings in each resistive change material block through the plurality of resistive change materials and the plurality of insulating materials of each resistive change material block. According to this method, each of these plurality of openings is formed between a different pair of the second insulating material in the plurality of second trenches. Finally, this method comprises flowing a second conductive material into each of the plurality of openings such that the plurality of resistive change materials are positioned between and in electrical communication with the second conductive material and the first conductive material.

Under one aspect of the present disclosure the resistive change material is a nanotube fabric.

Within another aspect of the present disclosure the resistive change material is phase change material.

Within another aspect of the present disclosure the resistive change element array is a memory array.

Other features and advantages of the present disclosure will become apparent from the description and drawings provided below.

BRIEF DESCRIPTION OF THE DRAWINGS

Example embodiments will be described and explained with additional specificity and detail through the use of the accompanying drawings in which:

FIG. 3 is a schematic, perspective view of a portion of a resistive change element array;

DESCRIPTION OF EMBODIMENTS

Figure 1A:
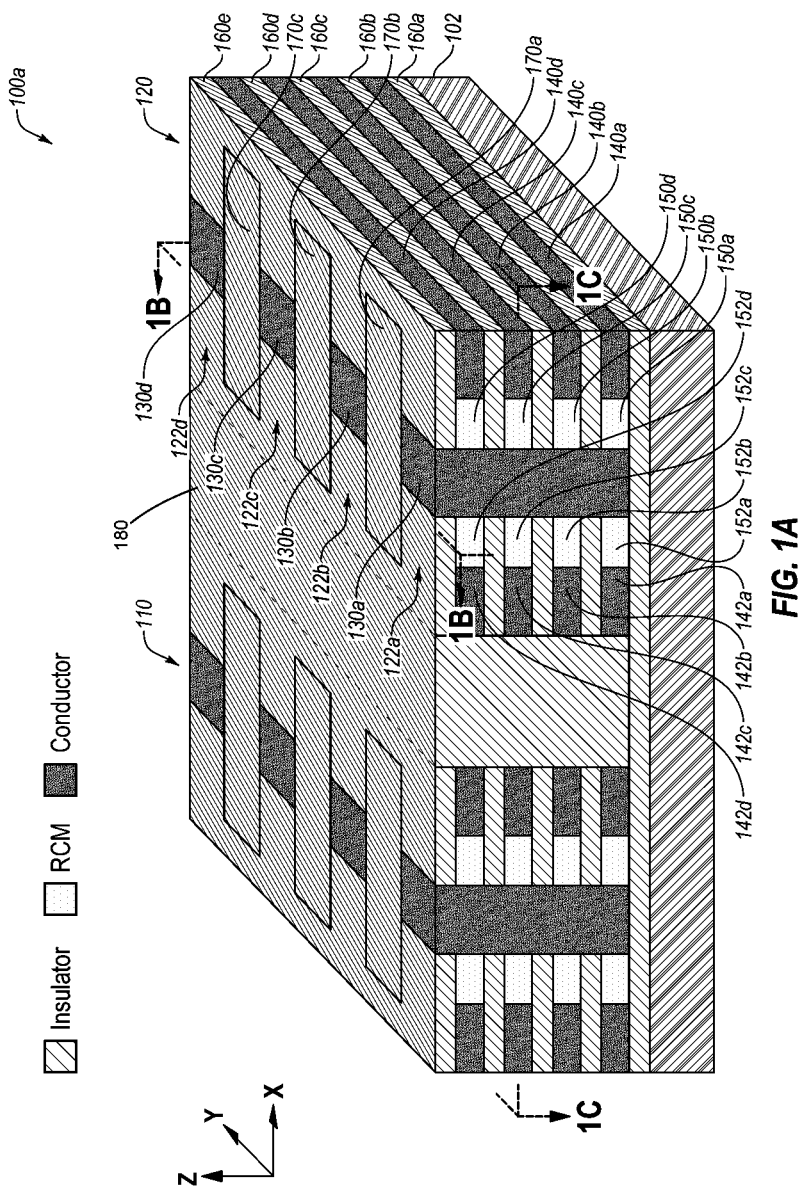
FIG. 1A is a schematic, perspective view of a portion of a resistive change element array.

The present disclosure relates to a resistive change element array. In some embodiments, the array may include multiple columns and rows of resistive change elements in a single layer. In these and other embodiments, the array may also include multiple layers that each include multiple horizontal columns and horizontal rows of resistive change elements that are vertically stacked. The array may include vertical access conductors and horizontal access conductors that are coupled by resistive change elements at each cross point between the vertical access conductors and horizontal access conductors. In these and other embodiments, one horizontal access conductor may be coupled to each resistive change element in one horizontal column of the array in a single layer. The horizontal access conductors may be accessed at a side of the array in a stair step arrangement. Alternately or additionally, one vertical access conductor may be coupled to resistive change elements in two adjacent horizontal columns of a single horizontal row for each vertically stacked layer of resistive change elements. The vertical access conductors may be connected by metal lines. The configuration of the resistive change element array may allow each resistive change element to be uniquely accessed by one vertical access conductor and one horizontal access conductor. As a result, each of the resistive change elements in the array may serve as a uniquely addressed memory element or cell. Thus, in some embodiments, the resistive change element array may function as a three-dimensional resistive change element memory array.

The present disclosure also relates to a method of forming a resistive change element array. In one method, a first resistive change layer may be deposited over a substrate and a first insulating layer may be formed over the first resistive change layer. The depositing and forming may be repeated to realize multiple resistive change layers separated by multiple insulating layers.

Multiple first trenches may be etched through the multiple resistive change layers and multiple insulating layers in a first direction after use of a first photolithography mask to form a three-dimensional array of resistive change blocks. Additionally, multiple second trenches may be etched through the multiple resistive change layers and the multiple insulating layers in each resistive change block in a second direction perpendicular to the first direction after use of a second photolithography mask. The multiple second trenches may not extend between the resistive change blocks. An insulating material may be deposited in each of the second trenches to form stack isolation regions.

In some embodiments, sidewalls of the resistive change blocks formed by the first trenches may be isotropically etched to recess the resistive change layers and form cavities in the sidewalls of the resistive change blocks. The recessing of the resistive change layers to form the cavities may expose the stack isolation regions such that portions of the resistive change layers between the stack isolation regions are electrically isolated from each other. After the etching, a first conductive material may be flowed into the first trenches and the cavities in the sidewalls of the resistive change blocks. As a result, the first conductive material may be in electrical communication with the resistive change layers.

Subsequently, the first conductive material may be partially removed such that the first conductive material remains only within the cavities. As a result, the resistive change blocks may be electrically isolated from each other. Additionally, the first conductive material may contact the resistive change layers such that for each resistive change layer, the portions of the resistive change layer between the stack isolation regions may be in electrical communication. The first conductive material remaining with the cavities may form the horizontal access conductors for the resistive change element array. After the first conductive material is partially removed, an insulating material may be deposited in each of the first trenches.

In some embodiments, multiple openings in each resistive change block may be formed through the resistive change layers and the insulating layers after use of a third photolithography mask. Each one of the openings in a resistive change block may be formed between a different pair of stack isolation regions in the resistive change block. The openings in the resistive change blocks may divide the resistive change layers into two resistive change elements. In these and other embodiments, a second conductive material may be flowed into each of the openings. The second conductive material flowed into the openings may form the vertical access conductors for the resistive change element array. The portions of the resistive change layers between the first and second conductive material may form the resistive change elements of the resistive change element array.

A fourth photolithography mask may be used to define areas for etching to expose the horizontal access conductors at one side of the resistive change element array in a stair step pattern for individual access of the horizontal access conductors. Thus, some embodiments of this disclosure describe a three-dimensional resistive change element array that may be formed using only four photolithography masks. Alternately or additionally, the method described in this disclosure allows for forming resistive change element arrays of varying number of layers without adjusting the processes to form the resistive change element arrays. For example, resistive change element arrays of 1 to 300 or more vertical layers of resistive change elements may be formed using the disclosed method. In some embodiments, a number of layers that may be included in a resistive change element array using the disclosed method may be limited only by a capability of etching processes and tolerances from mechanical stress.

Turning to the figures, FIG. 1A is a schematic, perspective view of a portion of resistive change element array 100. The resistive change element array 100 may be arranged in accordance with at least one embodiment described in the present disclosure. In some embodiments, the resistive change element array 100 may be fabricated using deposition, etching, patterning, and lithography techniques that are well understood by one skilled in the nanometer and sub-nanometer microelectronics fabrication arts. As illustrated in FIG. 1A, the resistive change element array 100 is a three-dimensional array formed on a substrate 102.

The substrate 102 may include an unprocessed semiconductor substrate. Alternately or additionally, the substrate 102 may include a semiconductor substrate with various process layers formed thereon including one or more semiconductor layers or other formations, and active or operable portions of semiconductor devices such as transistors, capacitors, electrodes, insulators, or any of a variety of components commonly utilized in semiconductor structures. The substrate 102 may include a semiconductive material such as monocrystalline silicon, polycrystalline silicon, germanium, and/or gallium arsenide. Alternately or additionally, the substrate 102 may include one or more epitaxial layers of silicon support by a base semiconductor foundation. Alternately or additionally, the substrate 102 may be formed or include silicon-on-sapphire (SOS) technology, silicon-on-insulator (SOI) technology, thin film transistor (TFT) technology, or any support structure with appropriate thermal conductivity and mechanical support for the resistive change element array 100.

In some embodiments, the resistive change element array 100 may be formed from resistive change element blocks, such as a first resistive change element block 110 and a second resistive change element block 120 illustrated in FIG. 1A. FIG. 1A illustrates two resistive change element blocks by way of illustration only. Any number of resistive change element blocks may be included in a resistive change element array. Each of the resistive change element blocks may include a similar structure. For ease of explanation, only the structure of the second resistive change element block 120 is described with respect to FIG. 1A.

In some embodiments, a block isolation region 180 may electrically isolate and physically separates the first resistive change element block 110 and the second resistive change element block 120. In some embodiments, the block isolation region 180 may be formed by one or more insulator materials. One or more of the insulator materials may be a dielectric material. The block isolation region 180 may extend in a first direction along sidewalls of the first resistive change element block 110 and the second resistive change element block 120. The first direction may be in a direction parallel to a surface of the substrate 102 that is adjacent to the first resistive change element block 110 and the second resistive change element block 120. As illustrated in FIG. 1A, the first direction may be in the "y" direction. The block isolation region 180 may run a length of the resistive change element array 100.

In some embodiments, the second resistive change element block 120 may be formed by multiple resistive change element stacks. FIG. 1A illustrates a first resistive change element stack 122a, a second resistive change element stack 122b, a third resistive change element stack 122c, and a fourth resistive change element stack 122d, referred to collectively as the resistive change element stacks 122. FIG. 1A illustrates four resistive change element stacks by way of illustration only. Any number of resistive change element stacks may be included in a resistive change element block.

In some embodiments, each of the resistive change element stacks 122 may include a similar structure. For ease of explanation, only the structure of the first resistive change element stack 122a is described with respect to FIG. 1A.

In some embodiments, the first resistive change element stack 122a may include multiple resistive change elements. The resistive change elements may be formed of resistive change material. Resistive change material is denoted as "RCM" in the Figures. The multiple resistive change elements may be arranged in two vertical columns of resistive change elements. For example, the first resistive change element stack 122a may include a first set of resistive change elements 150 in a first vertical column and may include second set of resistive change elements 152 in a second vertical column. The first set of resistive change elements 150 may include a first resistive change element 150a, a second resistive change element 150b, a third resistive change element 150c, and a fourth resistive change element 150d. The second set of resistive change elements 152 may include a fifth resistive change element 152a, a sixth resistive change element 152b, a seventh resistive change element 152c, and an eighth resistive change element 152d. FIG. 1A illustrates each of the vertical columns including four resistive change elements by way of illustration only. Any number of resistive change elements may be included in a vertical column of a resistive change element stack 122. For example, the number of resistive change elements that may be included in a vertical column may range between 1 and 300 or more.

In some embodiments, each of the first set of resistive change elements 150 and the second set of resistive change elements 152 may be configured to store information through the use of a resistive change material within each of the first set of resistive change elements 150 and the second set of resistive change elements 152. The resistive change material, responsive to electrical stimulus, may be adjusted between at least two non-volatile resistive states. In some embodiments, two resistive states may be used: a low resistive state and a high resistive state. In these and other embodiments, the low resistive state may correspond to a logic '1,' or a SET state and the high resistive state may correspond to a logic '0,' or a RESET state, or vice versa. The resistive change material including two non-volatile resistive states may allow each of the first set of resistive change elements 150 and the second set of resistive change elements 152 to be used to a store a bit of information. Thus, each of the first set of resistive change elements 150 and the second set of resistive change elements 152 may function as a 1-bit memory element. Alternately or additionally, the resistive change material may include more than two non-volatile resistive states. As a result, each of the first set of resistive change elements 150 and the second set of resistive change elements 152 to be used to a store more than one bit of information. For example, the resistive change material may include four non-volatile resistive states such that each of the first set of resistive change elements 150 and the second set of resistive change elements 152 may store two bits of information.

In some embodiments, the first set of resistive change elements 150 and the second set of resistive change elements 152 may be used as non-volatile memory devices for storing digital data (storing logic values as resistive states) within electronic devices (such as, but not limited to, cell phones, digital cameras, solid state hard drives, and computers). However, use of the resistive change element array 100 that includes the first set of resistive change elements 150 and the second set of resistive change elements 152 may not be limited to memory applications. The resistive change element array 100, as well as the advanced architectures taught by the present disclosure, may also be used within logic devices or within analog circuitry.

In some embodiments, a resistive change element, such as one of the first set of resistive change elements 150 and the second set of resistive change elements 152, may be adjusted, e.g. programmed, between different resistive states by applying an electrical stimulus across the resistive change element. For example, one or more first programming pulses of a particular voltage, current, and/or pulse width may be applied across a resistive change element to adjust the electrical resistance of the resistive change element from a first resistance state to a second resistance state. One or more second programming pulses may be used to adjust the electrical resistance of the resistive change element back to the first resistive state or a third resistive state.

In some embodiments, a resistive state of a resistive change element may be determined by applying a DC test voltage across the resistive change element and measuring the current through the resistive change element. In these and other embodiments, the current through the resistive change element may be measured using a power supply with a current feedback output. For example, the current feedback output may be a programmable power supply or a sense amplifier. Alternately or additionally, the current through the resistive change elements may be measured by inserting a current measuring device in series with the resistive change element.

Alternatively or additionally, a resistive state of a resistive change element may also be determined by driving a fixed DC current through the resistive change element and measuring the resulting voltage across the resistive change element. When measuring a voltage across or a current through the resistive change element, the electrical stimulus applied to the resistive change element may be limited such as to not alter the resistive state of the resistive change element. As a result, a current resistive state of the resistive change element may be determined without altering the current resistive state of the resistive change element. For example, when the resistive change element is configured as a memory cell, the state of the resistive change element may be determined through a read operation without disrupting the current resistive state. As a result, performing a read operation does not require a subsequent write operation to reprogram the resistive change element.

In some embodiments, the first set of resistive change elements 150 and the second set of resistive change elements 152 may use, for example, two-terminal nanotube switching elements, phase change memory, metal oxide memory cells, or conductive bridge memory (CBRAM), as well as other materials and designs. For example, the first set of resistive change elements 150 and the second set of resistive change elements 152 may be formed from materials including: metal oxide, solid electrolyte, phase change material such as a chalcogenide glass, and carbon nanotube fabrics. For example, U.S. Pat. No. 7,781,862 to Bertin et al., incorporated herein by reference in its entirety, discloses a two terminal nanotube switching device that includes a nanotube fabric layer. Bertin discloses methods for adjusting the resistivity of the nanotube fabric layer between multiple nonvolatile resistive states. In some embodiments, electrical stimulus may be applied to the nanotube fabric layer to pass an electric current through the nanotube fabric layer. Bertin explains that the electrical stimulus may be controlled within a certain set of particular parameters such that the resistivity of the nanotube fabric layer may be repeatedly switched between a first resistive state and a second resistive state, which may be used to store information as discussed above.

In some embodiments, a nanotube fabric layer may include a layer of multiple, interconnected carbon nanotubes. In these and other embodiments, the multiple, interconnected carbon nanotubes may have a structure of multiple entangled nanotubes that are irregularly arranged relative to one another. As a result, the nanotube fabric layer may be considered as a non-woven carbon nanotube (CNT) fabric.

Alternately or additionally, the multiple, interconnected carbon nanotubes of the nanotube fabric layer may possess some degree of positional regularity. For example, the nanotubes may include some degree of parallelism along long axes of the nanotubes. In some embodiments, the positional regularity may be found on a relatively small scale. For example, flat arrays of nanotubes may be arranged together along the long axes of the nanotubes in rafts on the order of one nanotube long and ten to twenty nanotubes wide. Alternately or additionally, the positional regularity may be found on a larger scale. For example, the positional regularity may be found with regions of ordered nanotubes that may extend over substantially the entire fabric layer.

As illustrated in FIG. 1A, in the resistive change element stacks 122, the first set of resistive change elements 150 may be stacked one on top of another in a vertical column in a second direction. The second direction may be perpendicular to the first direction. The second direction may extend in a direction perpendicular to the surface of the substrate 102 that is adjacent to the first resistive change element block 110 and the second resistive change element block 120. The second direction may be in the "z" direction as illustrated in FIG. 1A. As a result, the first set of resistive change elements 150 may be stacked such that each subsequently stacked resistive change element of the first set of resistive change elements 150 is located further from the substrate 102 than a previously stacked resistive change element. For example, the fourth resistive change element 150d may be located further from the substrate 102 than the first resistive change element 150a.

In some embodiments, the first set of resistive change elements 150 may be separated from one another by insulation layers 160, including a first insulation layer 160a, a second insulation layer 160b, a third insulation layer 160c, a fourth insulation layer 160d, and a fifth insulation layer 160e. For example, each of the first set of resistive change elements 150 may be separated and insulated from another of the first set of resistive change elements 150 by one of the insulation layers 160. For example, the second insulation layer 160b may separate and insulate the first resistive change element 150a from the second resistive change element 150b. The third insulation layer 160c may separate and insulate the second resistive change element 150b from the third resistive change element 150c and the fourth insulation layer 160*d* may separate and insulate the third resistive change element 150*c* from the fourth resistive change element 150*d*.

Alternately or additionally, the first insulation layer 160*a* may separate and insulate the first resistive change element 150*a* from the substrate 102. Alternately or additionally, the fifth insulation layer 160*e* may separate and insulate the fourth resistive change element 150*d* from additional materials that may be formed on a first side of the second resistive change element block 120 that is opposite a second side of the second resistive change element block 120 that is adjacent to and/or in contact with the substrate 102. The additional materials may include conductors, semiconductors, dielectrics, insulators, and other materials that may be formed in conjunction with the resistive change element array 100. For example, the additional materials may be conductors that may be used as bit lines for electrically accessing the resistive change elements in the resistive change element array 100. A number of the insulation layers 160 may be equal to a number of the resistive change elements 150 in the vertical column plus one additional insulation layer.

In some embodiments, the resistive change elements of each of the resistive change element stacks 122 may be separated and electrically isolated from other resistive change elements of the resistive change element stacks 122. In these and other embodiments, stack isolation regions 170 may separate and electrically isolated the resistive change elements of the different resistive change element stacks 122. The stack isolation regions 170 may extend in a third direction that is perpendicular to the first direction and the second direction. The third direction may be parallel to the surface of the substrate 102 that is adjacent to the first resistive change element block 110 and the second resistive change element block 120. As illustrated in FIG. 1A, the third direction may be in the "x" direction. The stack isolation regions 170 may extend further in the third direction than the resistive change elements 150 and the resistive change elements 152. However, the stack isolation regions 170 may not extend to the block isolation regions 180 on both sides of the resistive change element stacks 122. The stack isolation regions 170 may be formed by one or more insulator materials. One or more of the insulator materials may be a dielectric material.

For example, the stack isolation regions 170 may include a first stack isolation region 170*a*, a second stack isolation region 170*b*, and a third stack isolation region 170*c*. The first stack isolation region 170*a* may separate and electrically isolate the resistive change elements of the first resistive change element stack 122*a* from the resistive change elements of the second resistive change element stack 122*b*. The second stack isolation region 170*b* may separate and electrically isolate the resistive change elements of the second resistive change element stack 122*b* from the resistive change elements of the third resistive change element stack 122*c*. The third stack isolation region 170*c* may separate and electrically isolate the resistive change elements of the third resistive change element stack 122*c* from the resistive change elements of the fourth resistive change element stack 122*d*.

Figure 1B:
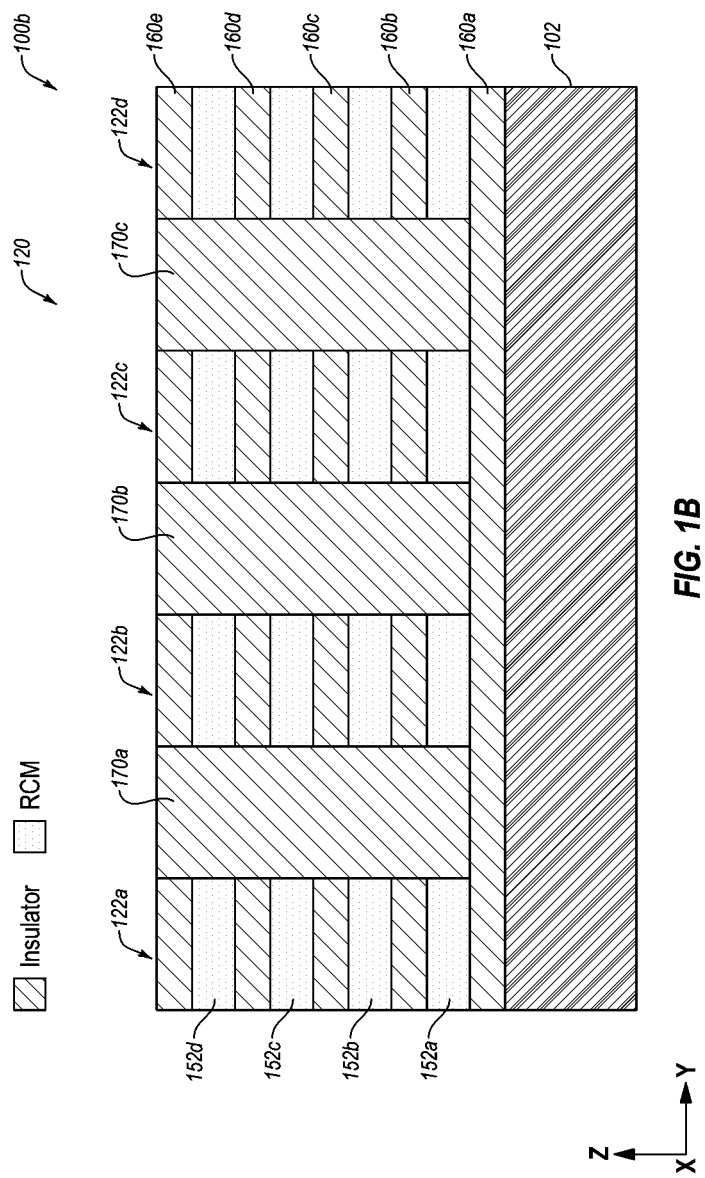
FIG. 1B is a sectional view of the resistive change element array of FIG. 1A, through cutline B-B.

FIG. 1B is a sectional view 100*b* of the resistive change element array 100 of FIG. 1A, through cutline B-B. The sectional view 100*b* may be arranged in accordance with at least one embodiment described in the present disclosure. The cutline B-B extends through the resistive change element stacks 122 and the stack isolation regions 170 of the second resistive change element block 120. As illustrated in FIG. 1B, the stack isolation regions 170 may separate and electrically isolate the resistive change elements of the resistive change element stacks 122.

In some embodiments, the stack isolation regions 170 may extend from the first insulation layer 160*a* past the resistive change elements that are located furthest from the substrate 102. In these and other embodiments, the stack isolation regions 170 have a first surface that is contact with the first insulation layer 160*a* and a second surface that is opposite the first surface. The second surface of the stack isolation regions 170 may be substantially coplanar with a first surface of the fifth insulation layer 160*e*. The first surface of the fifth insulation layer 160*e* may be opposite a second surface that is contact with the resistive change elements that are located furthest from the substrate 102.

FIG. 1B further illustrates the arrangement of the resistive change elements. As illustrated, the resistive change elements may be arranged in vertical columns that extend in the second direction, e.g., the "z" direction. The resistive change elements may be arranged in horizontal columns that extend in the first direction, e.g., the "y" direction. The resistive change elements in the resistive change element array 100 may also be arranged in horizontal rows that extend in the third direction, e.g., the "x" direction. The resistive change elements arranged in vertical columns, horizontal columns, and the horizontal rows result in the three-dimensional array of the resistive change elements. For example, the horizontal columns and the horizontal rows may reside in the XY plane and may be replicated N number of times where N is the number of vertical layers of the resistive change element array 100. A number of vertical layers may be equal to a number of resistive change elements in a vertical column. As described, each of the resistive change element blocks of the resistive change element array 100 may include two vertical columns and corresponding two horizontal columns of the resistive change elements of each of the horizontal rows of the resistive change elements. A number of resistive change elements in a vertical column of the resistive change element array 100 or a number of vertical layers of the resistive change element array 100 may range between 1 and 300 or more. A number of horizontal columns and the horizontal rows may vary based on dimensions of a device that may include the resistive change element array 100 and/or a number of the resistive change elements that may be included in the resistive change element array 100.

A size of the resistive change elements may vary based on a feature size "F" of lithography equipment during fabrication of the resistive change element array 100. Given a feature size of "F," the size of a resistive change element may be 3F in the third direction, e.g., the "x" direction and 2F in the first direction, e.g., the "y" direction. As a result, a size of the resistive change element may be $6F^2$ for a single vertical layer. However, the effective size of a resistive change element may decrease based on a number of vertical layers. In these and other embodiments, the effective size of the resistive layer may be $6F^2/N$, where N is the number of vertical layers of the resistive change element array 100.

Returning to FIG. 1A, in some embodiments, each of the first set of resistive change elements 150 and the second set of resistive change elements 152 may be in electrical communication with two conductors such that an electrical voltage and/or current may be individually applied to each of the first set of resistive change elements 150 and the second set of resistive change elements 152. In particular, each of the first set of resistive change elements 150 and the second set of resistive change elements 152 may have a first conductor in electrical communication with a first end of the resistive change elements and a second conductor in electrical communication with a second end of the resistive change elements. The first end may be opposite the second end in the third direction.

In some embodiments, a first vertical conductor 130a may be in electrical communication with the first set of resistive change elements 150 and the second set of resistive change elements 152. In these and other embodiments, each of the first set of resistive change elements 150 and the second set of resistive change elements 152 may be in electrical communication with the first vertical conductor 130a. As a result, all of the resistive change elements of the first resistive change element stack 122a may be in electrical communication with the first vertical conductor 130a. Alternately or additionally, no resistive change element of another resistive change element stack 122 may be in electrical communication with the first vertical conductor 130a. Rather, each of the resistive change element stacks 122 may include a vertical conductor with which all of the resistive change elements of the resistive change element stack 122 may be in electrical communication. For example, the second resistive change element stack 122b may include a second vertical conductor 130b. The third resistive change element stack 122c may include a third vertical conductor 130c and the fourth resistive change element stack 122d may include a fourth vertical conductor 130d. Each of the vertical conductors 130 may be separated and electrically isolated from each other by the stack isolation regions 170. Thus, in general, the resistive change element array 100 may include a vertical conductor for every two horizontal columns and each row. Thus, as an example, if the resistive change element array 100 includes ten horizontal columns and ten horizontal rows, the resistive change element array 100 may include fifty vertical conductors.

In some embodiments, the vertical conductors 130 may extend in the third direction. In these and other embodiments, the vertical conductors 130 may extend from the first insulation layer 160a past the resistive change elements that are located furthest from the substrate 102. In these and other embodiments, the vertical conductors 130 have a first surface that is contact with the first insulation layer 160a and a second surface that is opposite the first surface. The second surface of the stack isolation regions 170 may be substantially coplanar with the first surface of the fifth insulation layer 160e. Although not illustrated, the vertical conductors 130 may be electrically coupled to other conductors, such as metal lines. In some embodiments, the vertical conductors 130 may be electrically coupled to the metal lines directly or through selection transistors.

In some embodiments, each of the first set of resistive change elements 150 may also be in electrical communication with one horizontal conductor of a first set of horizontal conductors 140. In these and other embodiments, each of the second set of resistive change elements 152 may be in electrical communication with one horizontal conductor of a second set of horizontal conductors 142.

In some embodiments, the first set of horizontal conductors 140 and the second set of horizontal conductors 142 may be conductors that extend in the first direction. Each of the conductors of the first set of horizontal conductors 140 and the second set of horizontal conductors 142 may be in electrical communication with only one resistive change element of the first set of resistive change elements 150 and the second set of resistive change elements 152 of the first resistive change element stack 122a.

For example, the first set of horizontal conductors 140 may include a first horizontal conductor 140a, a second horizontal conductor 140b, a third horizontal conductor 140c, and a fourth horizontal conductor 140d. The first set of horizontal conductors 140 may be stacked one on top of another in the second direction in a similar manner as the first set of resistive change elements 150 are stacked one on top of another. As a result, the first horizontal conductor 140a may be in electrical communication with the first resistive change element 150a. The second horizontal conductor 140b may be in electrical communication with the second resistive change element 150b. The third horizontal conductor 140c may be in electrical communication with the third resistive change element 150c and the fourth horizontal conductor 140d may be in electrical communication with the fourth resistive change element 150d.

The second set of horizontal conductors 142 may include a first horizontal conductor 140a, a sixth horizontal conductor 142b, a seventh horizontal conductor 142c, and an eighth horizontal conductor 142d. The second set of horizontal conductors 142 may be arranged in a similar manner as the first set of horizontal conductors 140. As a result, the fifth horizontal conductor 142a may be in electrical communication with the fifth resistive change element 152a. The sixth horizontal conductor 142b may be in electrical communication with the sixth resistive change element 152b. The seventh horizontal conductor 142c may be in electrical communication with the seventh resistive change element 152c and the eighth horizontal conductor 142d may be in electrical communication with the eighth resistive change element 152d.

In some embodiments, each of the conductors of the first set of horizontal conductors 140 and the second set of horizontal conductors 142 may be in electrical communication with one resistive change element of each of the resistive change element stacks 122 in the second resistive change element block 120. For example, in some embodiments, the resistive change element array 100 may include a horizontal conductor for each horizontal column of the resistive change element array 100. Thus, as an example, if the resistive change element array 100 includes one-hundred horizontal columns in each vertical layer of the resistive change element array 100 and ten vertical layers, the resistive change element array 100 may include one-thousand horizontal conductors. In these and other embodiments, a horizontal conductor may be in electrical communication with each resistive change element of the corresponding horizontal column of the resistive change element array 100. As an example, each of the conductors of the first set of horizontal conductors 140 and the second set of horizontal conductors 142 being in electrical communication with one resistive change element of each of the resistive change element stacks 122 in the second resistive change element block 120 is illustrated in FIG. 1C.

Figure 1C:
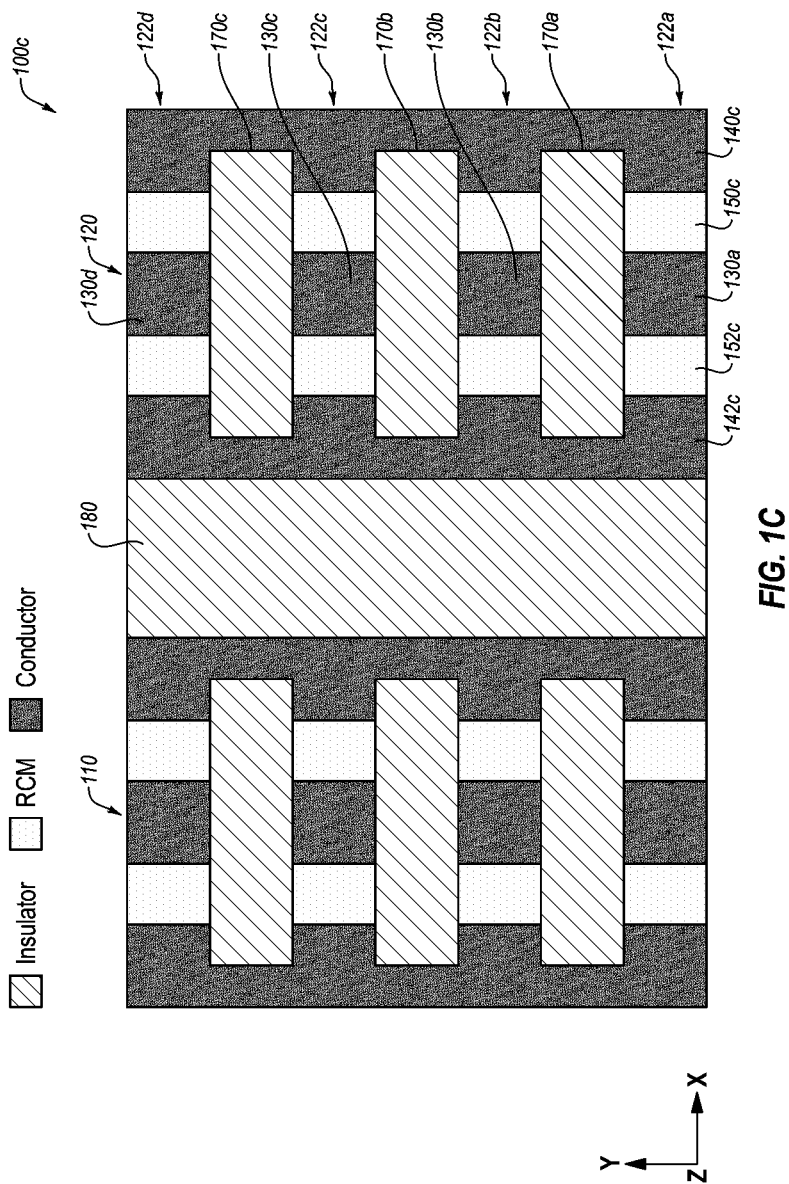
FIG. 1C is a sectional view of the resistive change element array of FIG. 1A, through cutline C-C.

FIG. 1C is a sectional view 100c of the resistive change element array 100 of FIG. 1A, through cutline C-C, parallel to the x-y plane. The sectional view 100c may be arranged in accordance with at least one embodiment described in the present disclosure. The sectional view 100c illustrates the third horizontal conductor 140c and the seventh horizontal conductor 142c. As illustrated, the third horizontal conductor 140c is in electrical communication with the third resistive change element 150c and with one resistive change element of each of the second, third, and fourth resistive change element stacks 122b-122d. Alternately or additionally, the seventh horizontal conductor 142c is in electrical communication with the seventh resistive change element 152c and with a different one of the resistive change elements of each of the second, third, and fourth resistive change element stacks 122b-122d.

Returning to FIG. 1A, as explained each of the resistive change elements in the resistive change element array 100 is coupled between one vertical conductor and one horizontal conductor. As a result, each of the resistive change elements may be electrically accessed individually to determine an individual resistive state of each of the resistive change elements. In these and other embodiments, the vertical conductors may be accessed through metal lines above a surface of the resistive change element array 100 opposite the substrate 102. The horizontal conductors may be accessed through either side of the resistive change element array 100 through which the horizontal conductors extend. For example, a side of the resistive change element array 100 that resides in the ZX plane as illustrated in FIG. 1A.

Figure 1D:
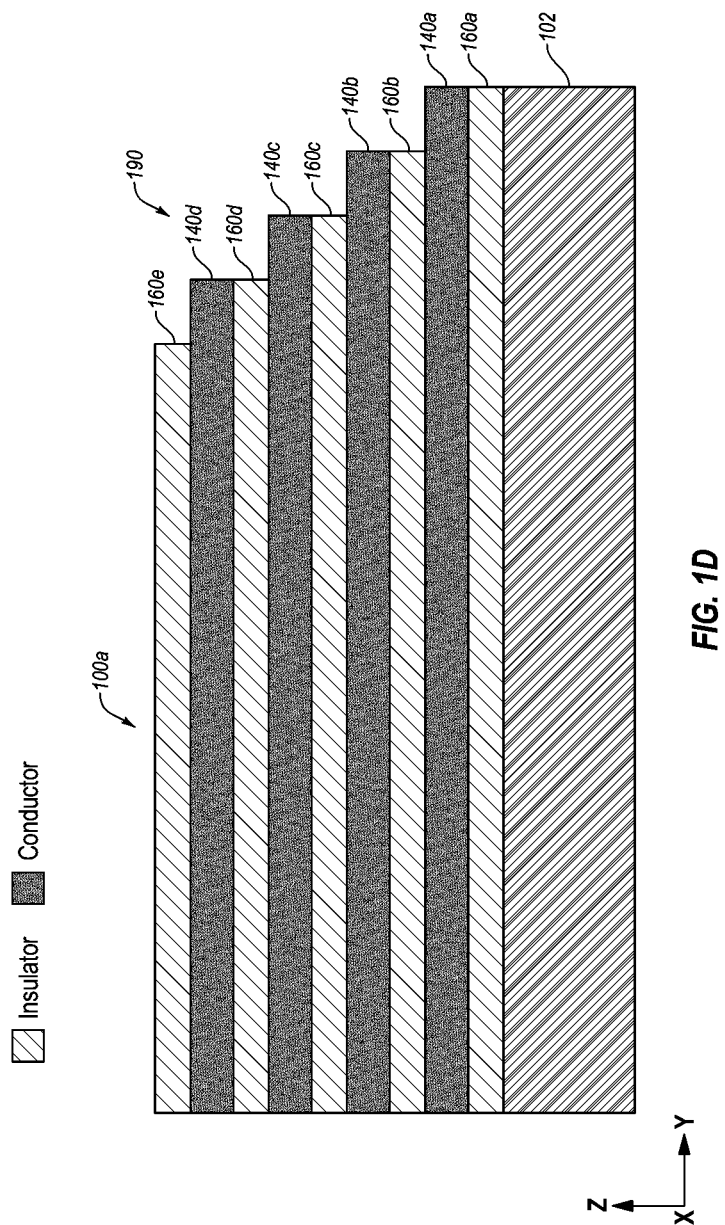
FIG. 1D is a schematic side view of the resistive change element array of FIG. 1A with an exposed electrical connection area.

FIG. 1D is a schematic side view of the resistive change element array of FIG. 1A with an exposed electrical connection area. The schematic side view may be arranged in accordance with at least one embodiment described in the present disclosure. FIG. 1D illustrates the resistive change element array 100, in particular, a cross-section in the ZY plane of the resistive change element array 100. FIG. 1D also illustrates an electrical connection area 190 not illustrated in FIG. 1A. As illustrated in FIG. 1D, the horizontal conductors 140 and the insulation layers 160 extend from the resistive change element array 100 into the electrical connection area 190. In the electrical connection area 190, the horizontal conductors 140 and the insulation layers 160 are of varying length. As illustrated, the horizontal conductors 140 and the insulation layers 160 closest to the substrate 102 may be longer than the other horizontal conductors 140 and the insulation layers 160. As a distance from the substrate 102 increase, a length of the horizontal conductors 140 and the 160 may decrease to form a stair step pattern. As a result, each of the horizontal conductors 140 may be exposed to allow an electrical connection to a metal line such that the resistive change elements may be electrically accessed by way of the horizontal conductors 140.

Figure 5:
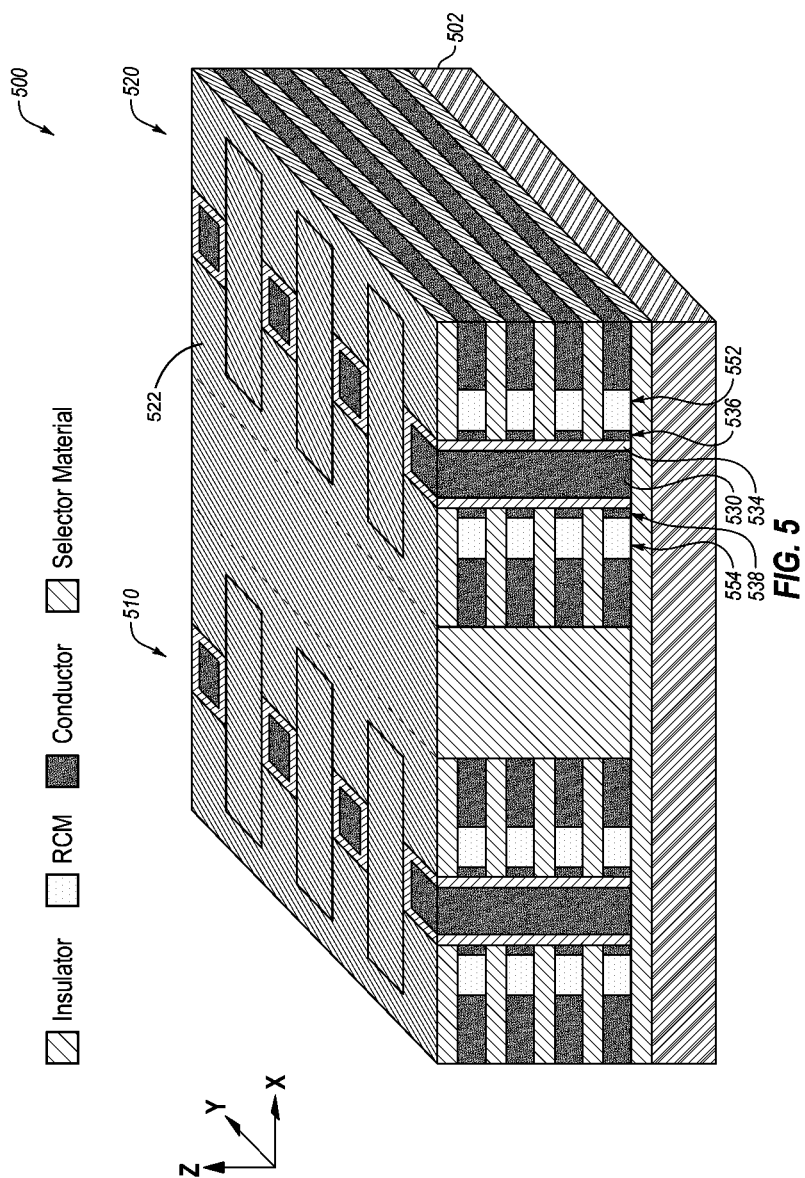
FIG. 5 is a schematic, perspective view of a portion of a resistive change element array.

Modifications, additions, or omissions may be made to the resistive change element array 100 without departing from the scope of the present disclosure. For example, in some embodiments, the resistive change element array 100 may include additional materials and/or layers. For example, the block isolation region 180 may include multiple materials. Alternately or additionally, one or more of the stack isolation regions 170 may include multiple materials. Other examples of modifications, additions, or omissions that may be performed on the resistive change element array 100 are illustrated in FIGS. 3 and 5.

Figure 2A:
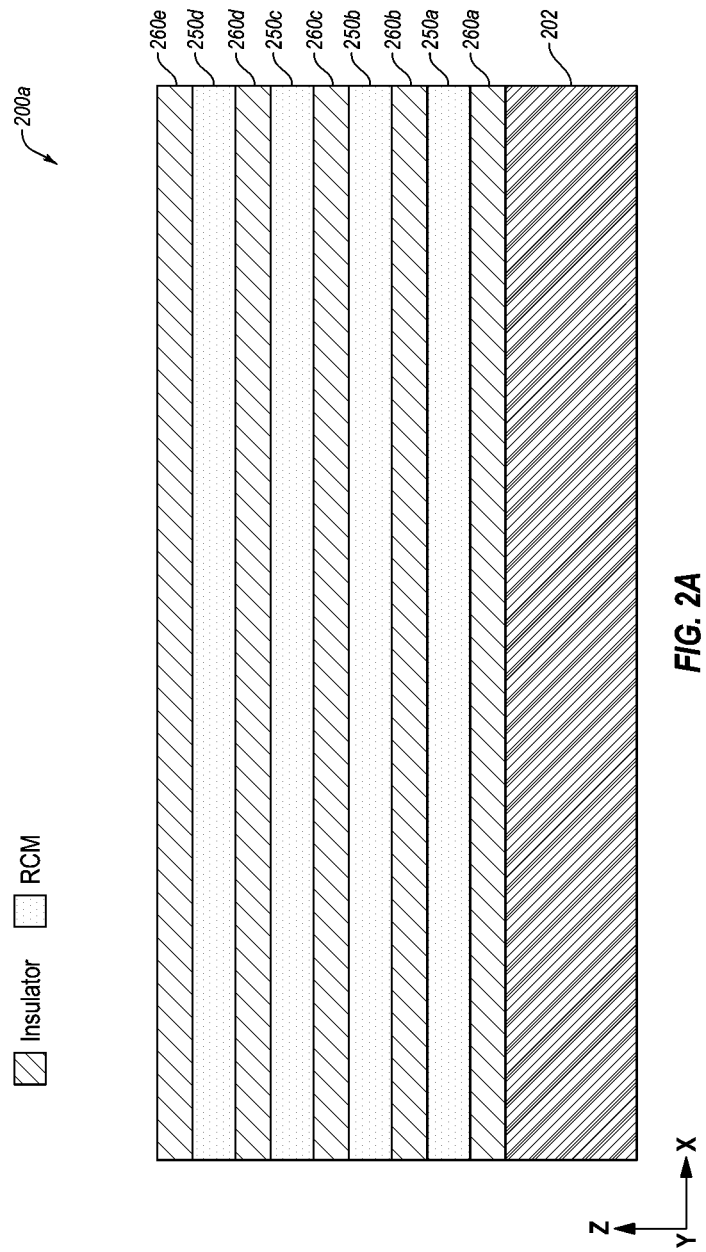
FIG. 2A is a cross-sectional view of alternating layers of insulating material and resistive change material during fabrication of a resistive change element array.

FIGS. 2A-2K illustrate various stages of a resistive change element array during an example method to fabricate the resistive change element array. For example, FIG. 2A is a cross-sectional view of alternating layers of insulating material and resistive change material during fabrication of a resistive change element array 200a arranged in accordance with at least one embodiment described in the present disclosure. The cross-sectional view may be of a XZ plane of the resistive change element array 200a. The resistive change element array 200a may include a substrate 202, a first insulation layer 260a, a second insulation layer 260b, a third insulation layer 260c, a fourth insulation layer 260d, a fifth insulation layer 260e, referred to collectively as the insulation layers 260 and a first resistive change layer 250a, a second resistive change layer 250b, a third resistive change layer 250c, and a fourth resistive change layer 250d, referred to collectively as the resistive change layers 250.

In some embodiments, the substrate 202 may be analogous to the substrate 102 and thus no further description is provided with respect to FIG. 2A.

In some embodiments, the insulation layers 260 may be formed from insulator material. For example, the insulation layers 260 may include one or more insulation materials including: silicon dioxide ($SiO_2$), silicon nitride ($SiN_X$), a silicate glass (doped or un-doped), other suitable dielectric material such as a low dielectric constant (i.e., low-k) material, or combinations thereof. In some embodiments, each of the insulation layers 260 may be formed from the same material, some of the insulation layers 260 may be formed of the same material and other of a different material, or each of the insulation layers 260 may be formed by a different insulation material.

In some embodiments, the insulation layers 260 may be deposited by any one of a number of deposition techniques. For example, the insulation layers 260 may be deposited using physical vapor deposition (PVD) (evaporation, sputtering or ablation of the film-forming material), chemical vapor deposition (CVD), in which gases, evaporating liquids, or chemically gasified solids are used as the source material, among other techniques such as vapor phase epitaxy (VPE) or a spin-on dielectric (SOD) process.

In some embodiments, the resistive change layers 250 may be formed from a resistive change material including: metal oxide, solid electrolyte, phase change material such as a chalcogenide glass, and carbon nanotube fabrics. In these and other embodiments, the carbon nanotube fabrics may be analogous to the nanotube fabrics described with respect to FIG. 1A.

In some embodiments, the resistive change layers 250 may be deposited by PVD, CVD, or a VPE process. Alternately or additionally, the resistive change layers 250 may be deposited by solution depositing the material and spin coating the material to form a resistive change layer. The type of process used to form the resistive change layers 250 may depend on the resistive change material used to form the resistive change layers 250.

To form the resistive change element array 200a, the first insulation layer 260a may be deposited on and in direct contact with the substrate 202. After deposition of the first insulation layer 260a. The first resistive change layer 250a may be deposited on and in direct contact with the first insulation layer 260a. The remaining insulation layers 260 and the remaining resistive change layers 250 may be alternately deposited to form the resistive change element array 200a as illustrated. A layer furthest from the substrate 202 may be an insulation layer 260 such that there is one more insulation layer 260 than a number of resistive change layers 250.

Modifications, additions, or omissions may be made to the resistive change element array 200a without departing from the scope of the present disclosure. For example, in some embodiments, the resistive change element array 200a may include more than nine layers. For example, the resistive change element array 200a may include any number of layers. Alternately or additionally, each of the insulation layers 260 may be formed from one or more insulation layers. For example, the first insulation layer 260a may be formed from multiple insulation layers. In these and other embodiments, each of the multiple insulation layers may be formed from the same or different insulation material.

Figure 2B:
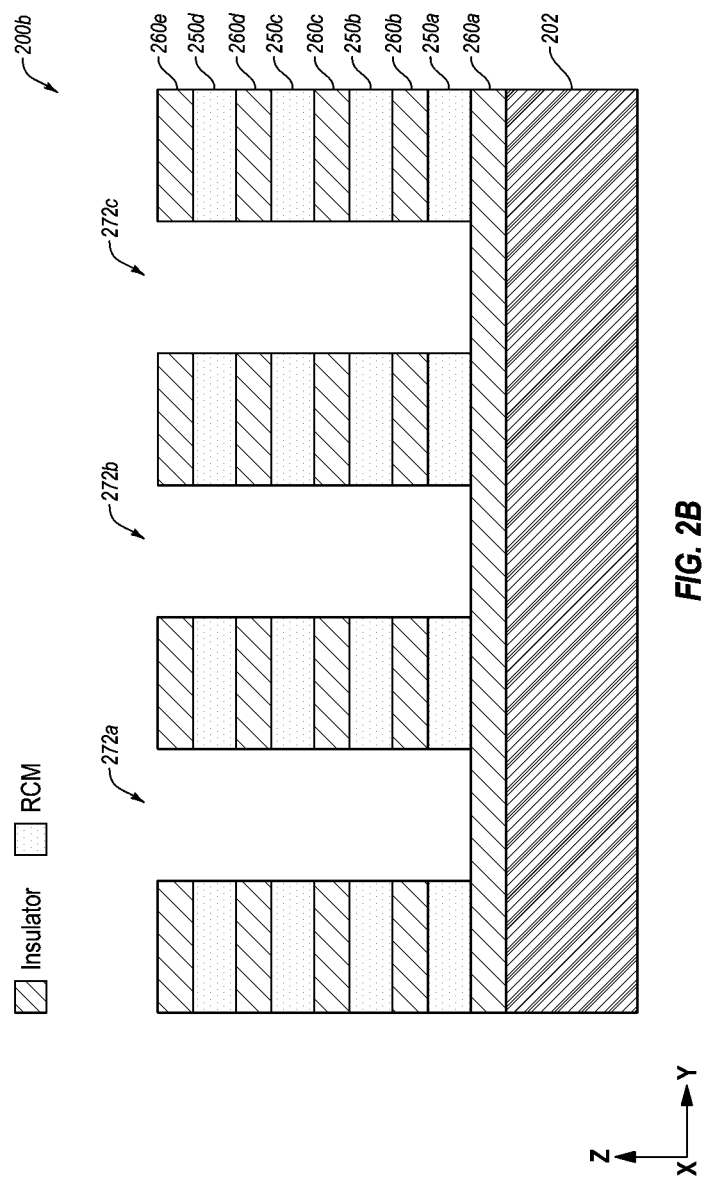
FIG. 2B is a cross-sectional view of first trenches in alternating layers of insulating material and resistive change material during fabrication of a resistive change element array.

FIG. 2B is a cross-sectional view of trenches in alternating layers of insulating material and resistive change material during fabrication of a resistive change element array 200b arranged in accordance with at least one embodiment described in the present disclosure. The resistive change element array 200b illustrates a first trench 272a, a second trench 272b, and a third trench 272c, referred to collectively as the trenches 272, formed in the resistive change layers 250 and the insulation layers 260. In some embodiments, the trenches 272 may be defined in a mask material formed on the resistive change element array 200b using a first lithography process and a first photomask. The mask material may be a resist or hard mask material.

After the trenches 272 are defined in the mask material, the trenches 272 may be etched in the resistive change layers 250 and the insulation layers 260 except for the first insulation layer 260a. In these and other embodiments, the first insulation layer 260a may be formed of a different material from the other of the insulation layers 260 such that the etching of the trenches 272 does not result in the etching of the first insulation layer 260a.

In some embodiments, the trenches 272 may be etched using a reactive ion etch (RIE) or a chemical etch. In some embodiments, the etching may be directional etch such that sidewalls of the trenches 272 are substantially vertical, e.g., substantially perpendicular to the surface of the substrate 202 parallel to the resistive change layers 250 and insulation layers 260 and/or in contact with the first insulation layer 260a.

In some embodiments, the trenches 272 may result in the formation of resistive change element stacks of the resistive change element array 200, such as the resistive change element stacks 122 of FIG. 1A.

Modifications, additions, or omissions may be made to the resistive change element array 200b without departing from the scope of the present disclosure. The resistive change element array 200b illustrates three trenches 272. However, any number of trenches may be formed in the resistive change element array 200b.

Figure 2C:
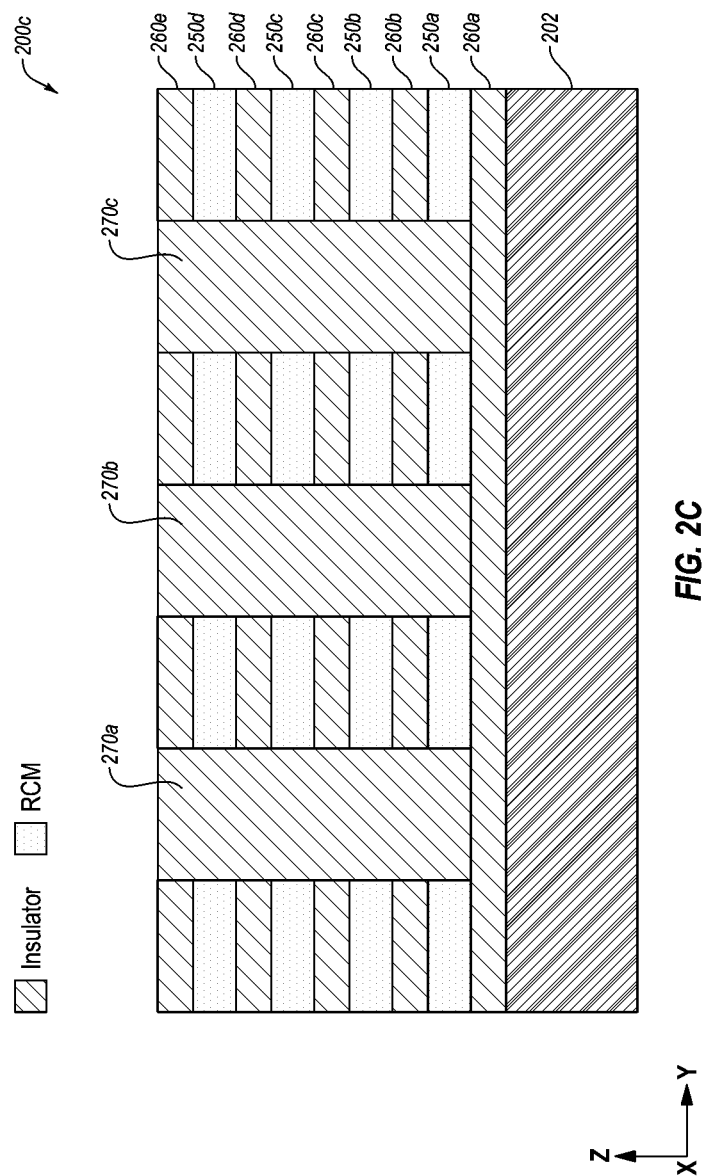
FIG. 2C is a cross-sectional view of first isolation regions in alternating layers of insulating material and resistive change material during fabrication of a resistive change element array.

FIG. 2C is a cross-sectional view of first isolation regions in alternating layers of insulating material and resistive change material during fabrication of a resistive change element array 200c arranged in accordance with at least one embodiment described in the present disclosure. The cross-sectional view may be of a YZ plane of the resistive change element array 200c.

The resistive change element array 200c illustrates a first isolation region 270a, a second isolation region 270b, and a third isolation region 270c, referred to collectively as isolation regions 270. The isolation regions may be formed by one or more insulation materials. The insulation materials may be silicon dioxide ($SiO_2$), silicon nitride ($SiN_x$), a silicate glass (doped or un-doped), other suitable dielectric material such as a low dielectric constant (i.e., low-k) material, or combinations thereof. The insulation material of the isolation regions 270 may be the same or different from the insulation material of the insulation layers 260.

The insulation material may be deposited by any one of a number of deposition techniques, include PVD, CVD, VPE, or other deposition techniques. The insulation material may be deposited to completely fill the trenches 272 and form the isolation regions 270. The isolation regions 270 may be analogous to the stack isolation regions 170 of FIG. 1A.

After deposition of the insulation material to fill the trenches 272, the resistive change element array 200c may be planarized to remove the insulation material outside of the trenches 272 so that the top surface of isolation regions 270 is substantially coplanar with the top surface of the fifth insulator 260e. The planarization may be chemical-mechanical planarization (CMP) or another type of planarization technique.

Modifications, additions, or omissions may be made to the resistive change element array 200c without departing from the scope of the present disclosure. For example, in some embodiments, a first insulation material may be deposited in the trenches 272. After deposition of the first insulation material, a second insulation material may be deposited in the trenches 272 over the first insulation material. Thus, the isolation regions 270 may be formed of multiple insulation materials. Any number of insulation materials may be used in the formation of the isolation regions 270.

Figure 2D:
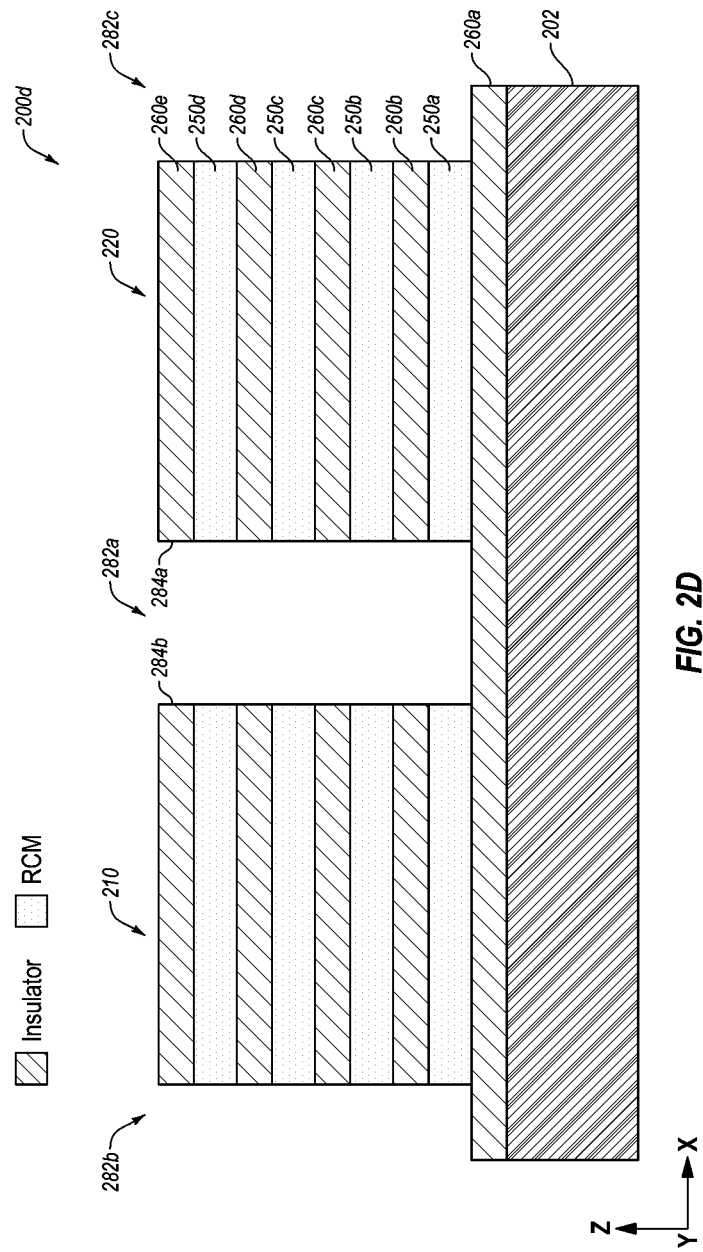
FIG. 2D is a cross-sectional view of second trenches in alternating layers of insulating material and resistive change material during fabrication of a resistive change element array.

FIG. 2D is a cross-sectional view of trenches in alternating layers of insulating material and resistive change material during fabrication of a resistive change element array 200d arranged in accordance with at least one embodiment described in the present disclosure. The cross-sectional view may be of a XZ plane of the resistive change element array 200d.

The resistive change element array 200d may illustrate a first trench 282a, a second trench 282b, and a third trench 282c, referred to collectively as the trenches 282, formed in the resistive change layers 250 and the insulation layers 260. In some embodiments, the trenches 282 may be defined in a mask material formed on the resistive change element array 200d using a second lithography process and a second photomask. The mask material may be a resist or hard mask material.

After the trenches 282 are defined in the mask material, the trenches 282 may be etched in the resistive change layers 250 and the insulation layers 260 expect for the first insulation layer 260a. In these and other embodiments, the first insulation layer 260a may be formed of a different material from the other of the insulation layers 260 such that the etching of the trenches 282 does not result in the etching of the first insulation layer 260a.

In some embodiments, the trenches 282 may be etched using a RIE or a chemical etch. In some embodiments, the etching may be a directional etch such that sidewalls of the trenches 282, such as a first sidewall 284a and a second sidewall 284b of the first trench 282a, are substantially vertical, e.g., substantially perpendicular to the surface of the substrate 202 that is parallel to the resistive change layers 250 and insulation layers 260 and/or in contact with the first insulation layer 260a.

In some embodiments, the trenches 282 may result in the formation of a first resistive change element block 210 and a second resistive change element block 220 of the resistive change element array 200d. In some embodiments, the first resistive change element block 210 and the second resistive change element block 220 may be analogous to the first resistive change element block 110 and the second resistive change element block 120 of FIG. 1A.

Modifications, additions, or omissions may be made to the resistive change element array 200d without departing from the scope of the present disclosure. The resistive change element array 200d illustrates three trenches 282. However, any number of trenches may be formed in the resistive change element array 200d.

Figure 2E:
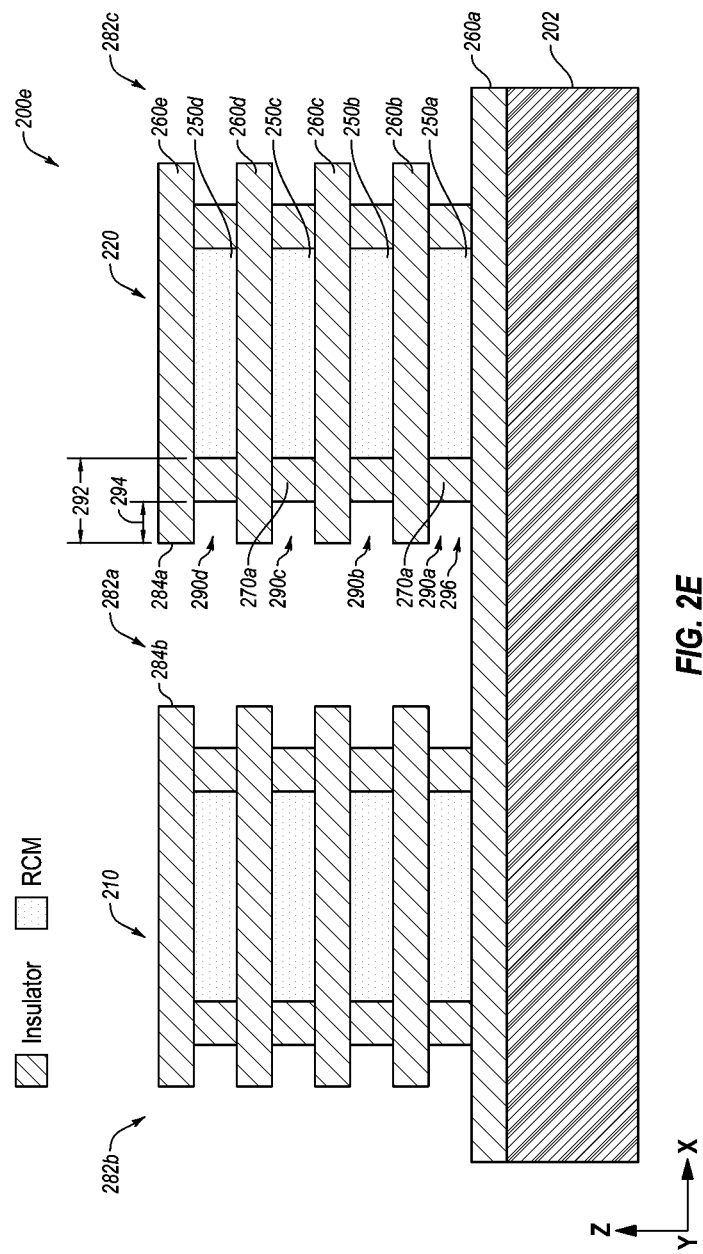
FIG. 2E is a cross-sectional view of etched resistive change material during fabrication of a resistive change element array.

FIG. 2E is a cross-sectional view of etched resistive change material during fabrication of a resistive change element array 200e arranged in accordance with at least one embodiment described in the present disclosure. The cross-sectional view may be of a XZ plane of the resistive change element array 200e. The resistive change element array 200e illustrates a first cavity 290a, a second cavity 290b, a third cavity 290c, and a fourth cavity 290d, referred to collectively as the cavities 290 formed in the first sidewall 284a. Analogous cavities are formed in the second sidewall 284b and sidewalls of the other trenches 282. For ease of explanation, only the cavities 290 along the first sidewall 284a are discussed with respect to FIG. 2E.

In some embodiments, the cavities 290 may be formed by etching of the resistive change layers 250 by way of the first trench 282a. For example, the resistive change layers 250 may be chemically etched to recess the resistive change layers 250 away from the first sidewall 284a. The resistive change layers 250 may be etched a distance 292 away from the first sidewall 284a. The chemical etchant may be selected such that the chemical etchant selectively etches the resistive change layers 250 and does not etch the insulation layers 260. The resistive change layers 250 may be etched such that portions of the resistive change layers 250 remain. In some embodiments, over 30, 40, 50, 60, 70, 80, or 90 percent of the resistive change layers 250 may remain after the etching of the resistive change layers 250.

In some embodiments, the etching that may be performed may be an isotropic etch. For example, the resistive change layers 250 may be isotropically etched using a plasma. For example, an oxygen plasma. In these and other embodiments, the type of chemical or plasma that may be used to etch the resistive change layers 250 may be based on a material used to form the resistive change layers 250.

An amount of etching of the resistive change layers 250, i.e., the distance 292 that the resistive change layers 250 may be recessed from the first sidewall 284a, may be controlled based on an amount of time that the etching process is performed. An amount of time for etching may be based on one or more factors: as such conditions for plasma and a flow rate of a material used in the plasma, such as oxygen, among other factors.

In some embodiments, the resistive change layers 250 may be etched to expose the first isolation region 270a. As a result, the cavities 290 may have sidewalls formed by the insulation layers 260 (above and below) and the isolation regions 270 (along the sides). For example, a first sidewall of the first cavity 290a and a second sidewall of the first cavity 290a opposite the first sidewall may both be parallel to the surface of the substrate 202 that is parallel to the resistive change layers 250 and insulation layers 260 and/or in contact with the first insulation layer 260a. In these and other embodiments, the first and second sidewalls may be formed by the first insulation layer 260a and the second insulation layer 260b, respectively. The first cavity 290a may include third and fourth sidewalls that are perpendicular to the surface of the substrate 202. The third sidewall may be opposite the fourth sidewall. The third sidewall may be formed by the first isolation region 270a. The fourth sidewall may be formed by another isolation region. In these and other embodiments, the third and fourth sidewalls may be shorter than the first and second sidewalls. As a result, a channel 296 may be formed between the first insulation layer 260a and the second insulation layer 260b along the entire Y direction of the resistive change element array 200e. A width of the channel 296 may be a distance 294. The distance 294 may be smaller than the distance 292. When the distance 294 is smaller than the distance 292, the isolation regions 270 and the insulation layers 260 may electrically isolate the resistive change layers 250. In these and other embodiments, a channel may be formed between every pair of the insulation layers 260 on both sides of the sidewalls 284 of every trench 282. Modifications, additions, or omissions may be made to the resistive change element array 200a without departing from the scope of the present disclosure.

Figure 2F:
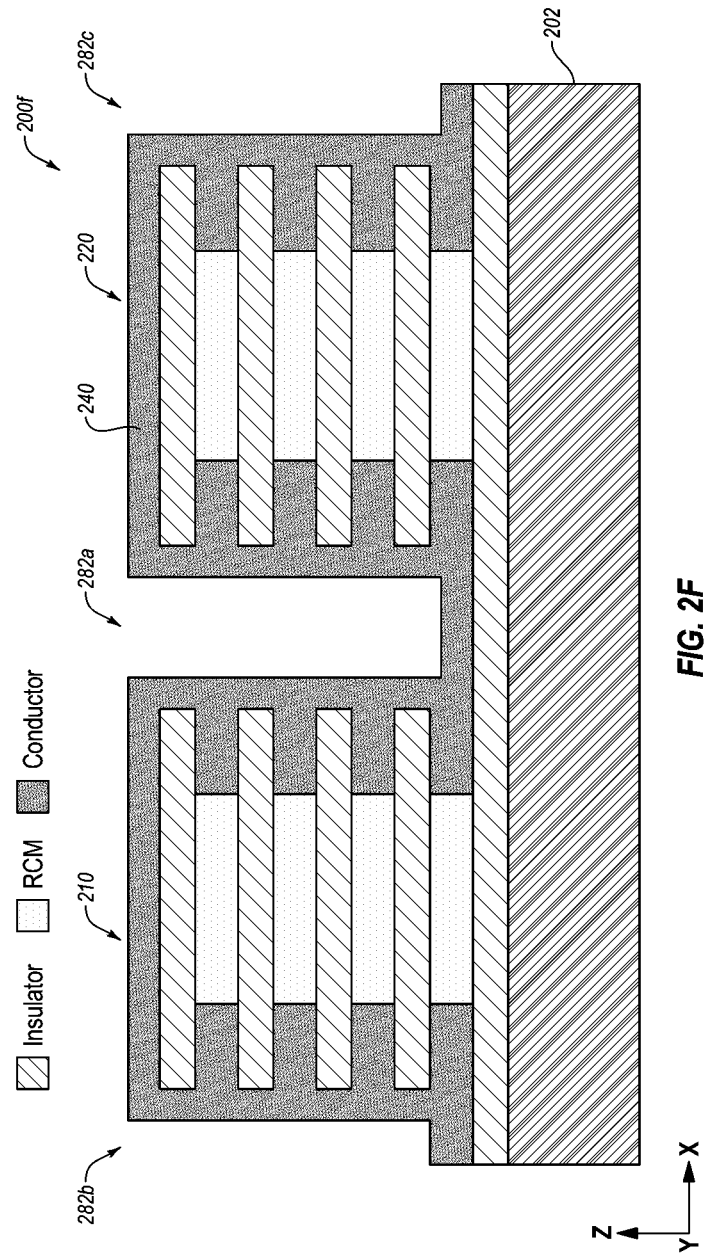
FIG. 2F is a cross-sectional view of a flowed first conductive material during fabrication of a resistive change element array.

FIG. 2F is a cross-sectional view of the array 200e after the deposition of a first conductive material during fabrication of a resistive change element array 200f arranged in accordance with at least one embodiment described in the present disclosure. The cross-sectional view may be of a XZ plane of the resistive change element array 200f. The resistive change element array 200f illustrates a conductive film 240 deposited over the first resistive change element block 210 and the second resistive change element block 220, and into the cavities 290 in the sidewalls 284 of the trenches 282. The conductive film 240 may be in electrical communication with each of the resistive change layers 250.

The conductive film 240 may be formed of a conductive material, such as titanium nitride TiN, Tantalum nitride TaN, Tungsten W, Cobalt C, and doped poly, among other conductive materials. The deposition process to form the conductive film 240 may be performed by CVD, PECVD, or ALD, among other deposition processes. The thickness of the conductive film 240 may be selected such that the conductive film 240 completely fills the cavities 290. The conductive film 240 may also completely fill the channels 296 in the sidewalls 284 of the trenches 282.

Modifications, additions, or omissions may be made to the resistive change element array 200f without departing from the scope of the present disclosure. For example, more than one conductive material may used to form the conductive film 240. For example, a first conductive material may be deposited followed by the deposition of a second conductive material to form the conductive film 240.

Figure 2G:
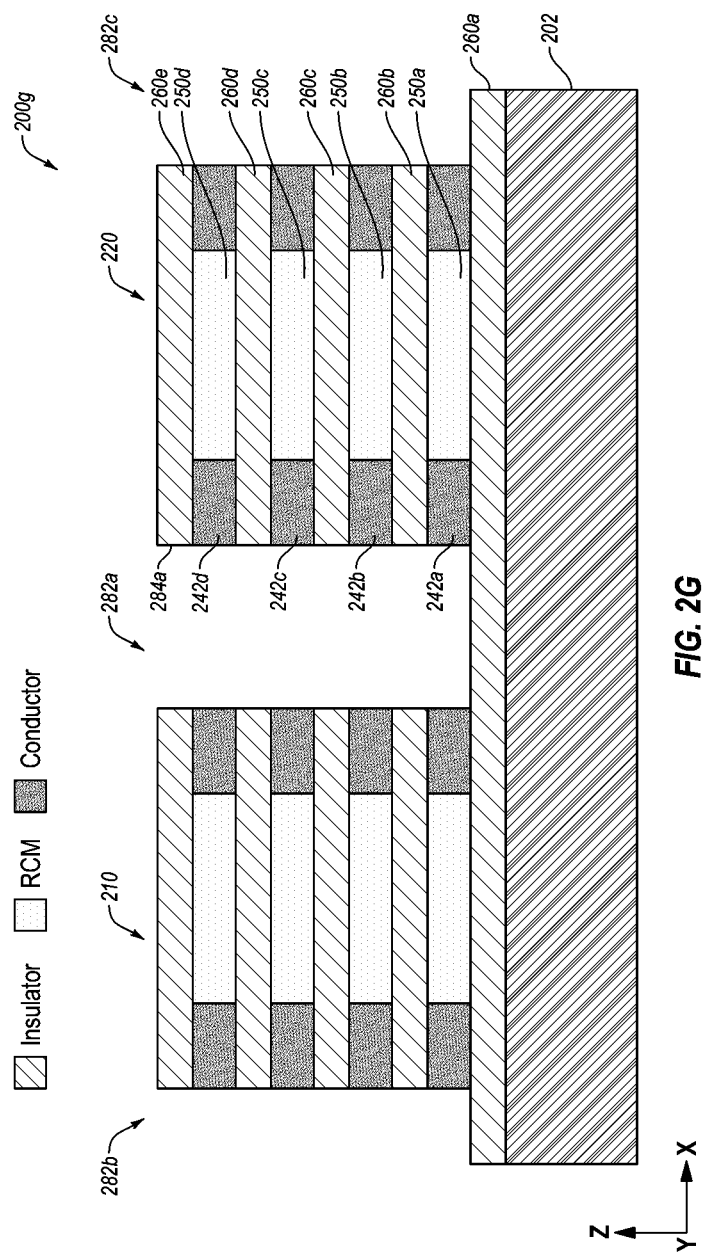
FIG. 2G is a cross-sectional view of horizontal conductors during fabrication of a resistive change element array.

FIG. 2G is a cross-sectional view of a resistive change element array 200g after the etching of conductor film 240 in accordance with at least one embodiment described in the present disclosure. The cross-sectional view may be of a XZ plane of the resistive change element array 200g. The resistive change element array 200g illustrates a first horizontal conductor 242a, a second horizontal conductor 242b, a third horizontal conductor 242c, and a fourth horizontal conductor 242d, referred to collectively as the horizontal conductors 242. The horizontal conductors 242 may be formed by etching of the conductive film 240. The conductive film 240 may be etched by removing the conductive film 240 outside of the cavities 290 and the channels 296. For example, the conductive film 240 may be etched by removing the conductive film 240 such that the horizontal conductors 242 form a planar surface with the sidewalls 284 of the trenches 282.

By etching the conductive film 240, the insulation layers 260 may electrically isolate the horizontal conductors 242 from one another. The electrically isolated horizontal conductors 242 may be electrically coupled to the resistive change layers 250 on a respective layer of the resistive change element array 200g. For example, the first horizontal conductor 242a may be electrically coupled to each portion of the first resistive change layer 250a in the second resistive change element block 220 of the resistive change element array 200g. The portions of the first resistive change layer 250a may be defined by the isolation regions 270 of the second resistive change element block 220. For example, the first horizontal conductor 242a may be electrically coupled to each portion of the first resistive change layer 250a in the second resistive change element block 220 by way of the channel 296.

The etching of the conductive film 240 may be performed by a wet or dry etch. Any type of appropriate etching processing may be performed to remove the conductive film 240. Modifications, additions, or omissions may be made to the resistive change element array 200g without departing from the scope of the present disclosure.

Figure 2H:
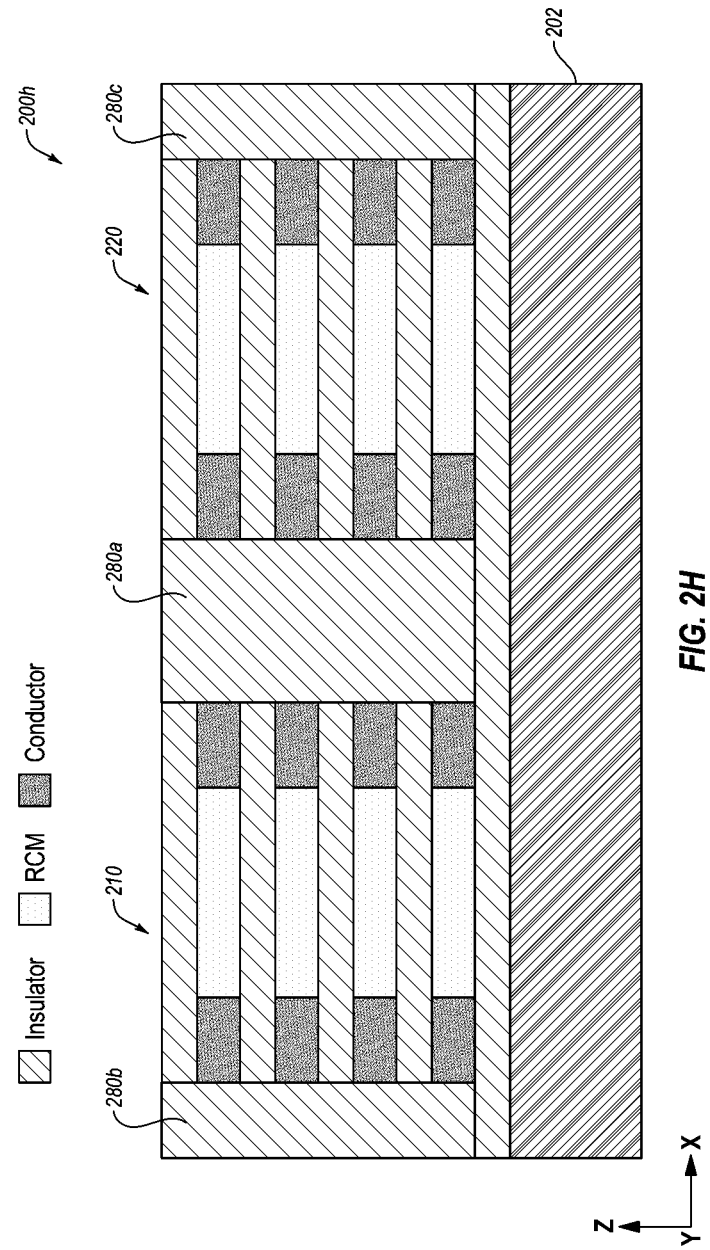
FIG. 2H is a cross-sectional view of second isolation regions a conductive material during fabrication of a resistive change element array.

FIG. 2H is a cross-sectional view of a resistive change element array 200h with the trenches 282 filled in accordance with at least one embodiment described in the present disclosure. The cross-sectional view may be of a XZ plane of the resistive change element array 200h.

The resistive change element array 200h illustrates a first isolation region 280a, a second isolation region 280b, and a third isolation region 280c, referred to collectively as isolation regions 280. The isolation regions may be formed by one or more insulation materials. The insulation materials may be silicon dioxide ($SiO_2$), silicon nitride ($SiN_x$), a silicate glass (doped or un-doped), other suitable dielectric material such as a low dielectric constant (i.e., low-k) material, or combinations thereof. The insulation material of the isolation regions 280 may be the same or different from the insulation material of the insulation layers 260 and the isolation regions 270.

The insulation material may be deposited by any one of a number of deposition techniques, include PVD, CVD, VPE, or other deposition techniques. The insulation material may be deposited to completely fill the trenches 282 and form the isolation regions 280. The isolation regions 280 may be analogous to the block isolation regions 180 of FIG. 1A.

After deposition of the insulation material to form the isolation regions 280, the resistive change element array 200h may be planarized to remove the insulation material outside of the trenches 282. The planarization may be chemical-mechanical planarization (CMP) or another type of planarization technique.

Modifications, additions, or omissions may be made to the resistive change element array 200h without departing from the scope of the present disclosure. For example, in some embodiments, a first insulation material may be deposited in the trenches 282. After deposition of the first insulation material, a second insulation material may be deposited in the trenches 282 over the first insulation material. Thus, the isolation regions 280 may be formed of multiple insulation materials. Any number of insulation materials may be used in the formation of the isolation regions 280.

Figure 2I:
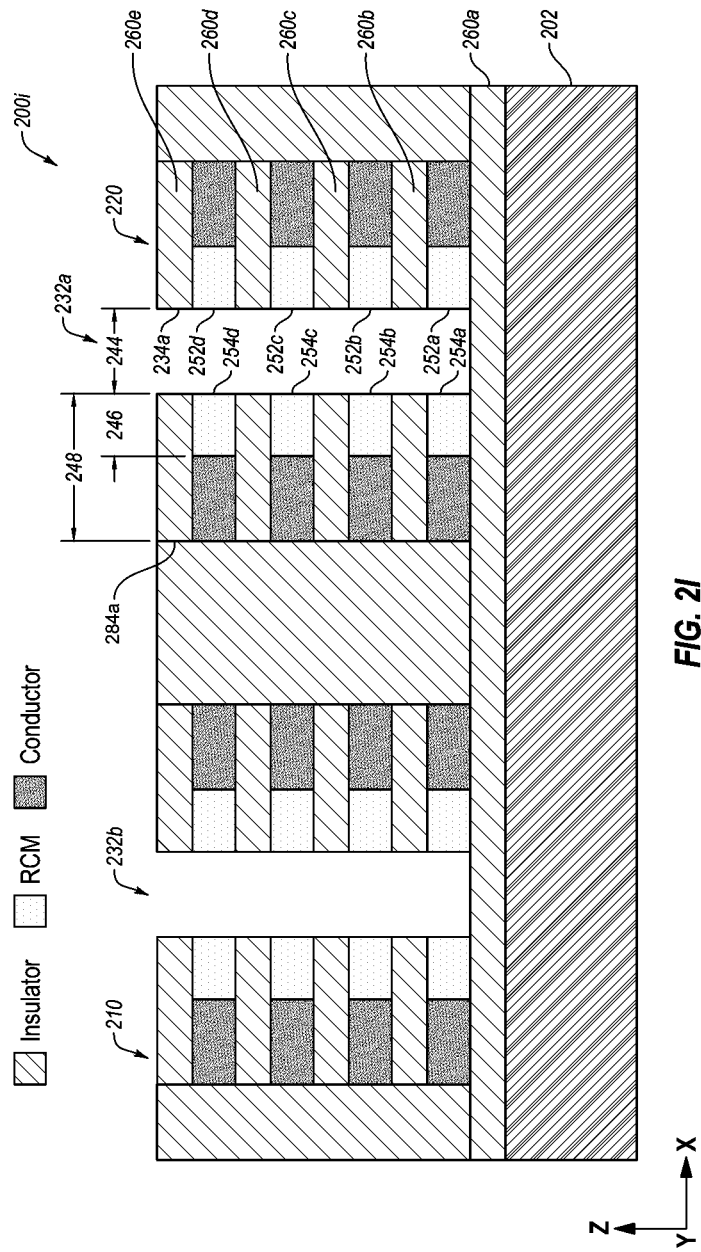
FIG. 2I is a cross-sectional view of third trenches in alternating layers of insulating material and resistive change material during fabrication of a resistive change element array.

FIG. 2I is a cross-sectional view of a resistive change element array 200i after forming third trenches in blocks 210 and 220 in accordance with at least one embodiment described in the present disclosure. The cross-sectional view may be of a XZ plane of the resistive change element array 200i.

The resistive change element array 200i may illustrate a first opening 232a and a second opening 232b, referred to collectively as the openings 232, formed in the resistive change layers 250 and the insulation layers 260. In some embodiments, the openings 232 may be defined in a mask material formed on the resistive change element array 200a using a third lithography process and a third photomask. The mask material may be a resist or hard mask material.

After the openings 232 are defined in the mask material, the openings 232 may be etched in the resistive change layers 250 and the insulation layers 260 except for the first insulation layer 260a. In these and other embodiments, the first insulation layer 260a may be formed of a different material from the other of the insulation layers 260 such that the etching of the openings 232 does not result in the etching of the first insulation layer 260a.

In some embodiments, the openings 232 may be etched using a RIE or a chemical etch. In some embodiments, the etching may be directional etch such that sidewalls 234 of the openings 232 are substantially vertical, e.g., substantially perpendicular to the surface of the substrate 202.

In some embodiments, the openings 232 may divide the resistive change layers 250 into a first set of resistive change elements 252 and a second set of resistive change elements 254. The first set of resistive change elements 252 may include a first resistive change element 252a, a second resistive change element 252b, a third resistive change element 252c, and a fourth resistive change element 252d. The first set of resistive change elements 252 may be analogous to the first set of resistive change elements 150 of FIG. 1A. The second set of resistive change elements 254 may include a fifth resistive change element 254a, a sixth resistive change element 254b, a seventh resistive change element 254c, and an eighth resistive change element 254d. The second set of resistive change elements 254 may be analogous to the second set of resistive change elements 152 of FIG. 1A.

The resistive change element array 200i may include a distance 248 between the first sidewall 284a of the first trench 282a and the sidewall 234a of the first opening 232a. In these and other embodiments, a width 244 of the openings may be defined to be in the range from 3 nanometers (nm) to 250 nanometers (nm) according to the number of layers 252 and available process capability. In these and other embodiments, a width 244 of the openings 232 may be configured such that a width 246 of the first set of resistive change elements 252 are a particular percentage of the distance 248. For example, the particular percentage may be between ten and sixty percent. For example, the particular percentage may be 10, 15, 20, 25, 30, 35, 40, 45, 50, 55, or 60 percent or some percent therebetween. As an example in some devices, the width 246 of the second set of resistive change elements 254 may be between 5 nanometers (nm) and 60 nm.

Modifications, additions, or omissions may be made to the resistive change element array 200i without departing from the scope of the present disclosure. For example, in some embodiments, the first opening 232a may include a circular cross-section in a plane parallel to the surface of the substrate 202. Alternately or additionally, the first opening 232a may include an oval, rectangular, hexagonal, or other shape in a cross-section in the plane parallel to the surface of the substrate 202.

Figure 2J:
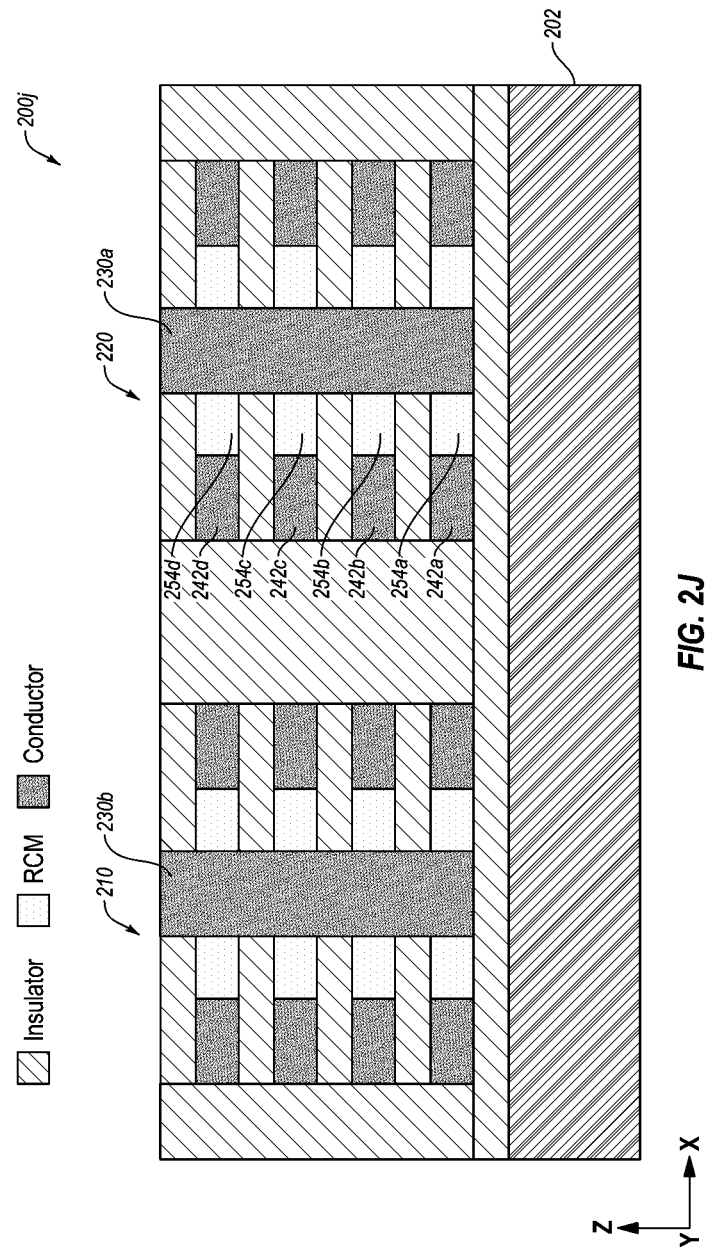
FIG. 2J is a cross-sectional view of vertical conductors during fabrication of a resistive change element array.

FIG. 2J is a cross-sectional view showing vertical conductors formed during fabrication of a resistive change element array 200j arranged in accordance with at least one embodiment described in the present disclosure. The cross-sectional view may be of a XZ plane of the resistive change element array 200j. The resistive change element array 200j illustrates a first vertical conductor 230a, a second vertical conductor 230b, collectively referred to as vertical conductors 230 formed in the first opening 232a and the second opening 232b, respectively.

The vertical conductors 230 may be formed of a conductive material, such as titanium nitride TiN, Tantalum nitride TaN, Tungsten W, Cobalt C, and doped poly, among other conductive material. The deposition process to form the vertical conductors 230 may be performed by CVD, PVD, PECVD, or ALD, among other deposition processes. The thickness of the vertical conductors 230 may be selected such that the vertical conductors 230 completely fill the openings 232. After deposition of the conductive material to form the vertical conductors 230, the resistive change element array 200j may be planarized to remove the conductive material outside of the vertical conductors 230. The planarization may be chemical-mechanical planarization (CMP) or another type of planarization technique.

In some embodiments, the vertical conductors 230 may be in electrical communication with the resistive change elements formed from the resistive change layers 250 by the formation of the openings 232. For example, the first vertical conductor 230a may be in electrical communication with the first set of resistive change elements 252 and with the second set of resistive change elements 254. As such the vertical conductors 230 may be configured as first conductors of sets of conductors for each of the resistive change elements in the resistive change element array 200j.

For example, the first vertical conductor 230a and the first horizontal conductor 242a may form a set of conductors for the fifth resistive change element 254a, the first vertical conductor 230a and the second horizontal conductor 242b may form a set of conductors for the sixth resistive change element 254b, the first vertical conductor 230a and the third horizontal conductor 242c may form a set of conductors for the seventh resistive change element 254c, and the first vertical conductor 230a and the fourth horizontal conductor 242d may form a set of conductors for the eighth resistive change element 254d. As illustrated, the vertical conductors 230 may be analogous to the vertical conductors 130 of FIG. 1A.

Modifications, additions, or omissions may be made to the resistive change element array 200j without departing from the scope of the present disclosure. For example, more than one conductive material may be used to form the vertical conductors 230. For example, a first conductive material may be deposited followed by the deposition of a second conductive material to form the vertical conductors 230. As another example, the cross-sectional shape of the vertical conductors 230 in the plane parallel to the surface of the substrate 202 may vary. In these and other embodiments, the cross-sectional shape of the vertical conductors 230 may be similar to the cross-sectional shape of the openings 232.

Figure 2K:
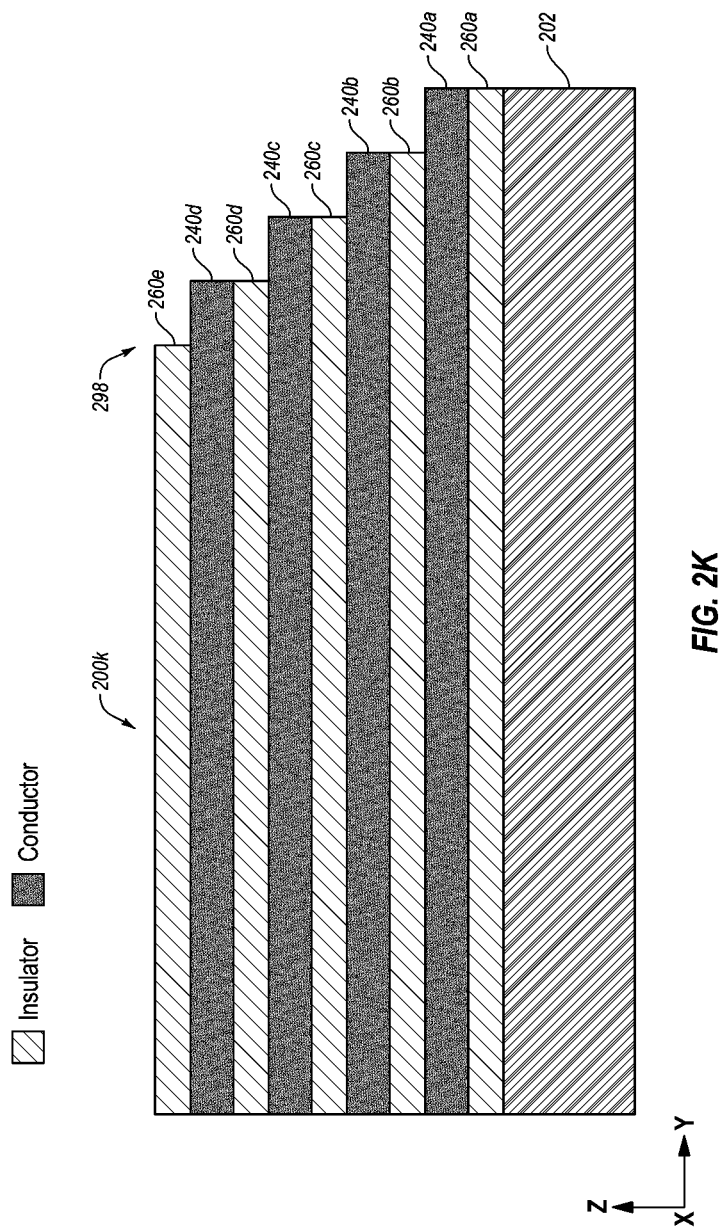
FIG. 2K is a schematic side view of an exposed electrical connection area.

FIG. 2K is a schematic side view of a resistive change element array 200k with an exposed electrical connection area 298 arranged in accordance with at least one embodiment described in the present disclosure. The cross-sectional view may be of a YZ plane of the resistive change element array 200k.

As illustrated in FIG. 2K, the horizontal conductors 240a-240d and the insulation layers 260a-260e extend from the resistive change element array 200k into the electrical connection area 298. In the electrical connection area 298, the horizontal conductors 240a-240d and the insulation layers 260a-260e are of varying length. As illustrated, the horizontal conductors 240a-240d and the insulation layers 260a-260e closest to the substrate 202 may be longer than the other horizontal conductors 242 and the insulation layers 260a-260e. As a distance from the substrate 202 increase, a length of the horizontal conductors 240a-240d and the 260a-260e may decrease to form a stair step pattern. As a result, each of the horizontal conductors 240a-240d may be exposed to allow an electrical connection to a metal line such that the resistive change elements may be electrically accessed by way of the horizontal conductors.

The varying lengths of the conductive film 240a-240d and the insulation layers 260a-260e may be defined using mask materials formed on the electrical connection area 298 using a fourth lithography process and a fourth photomask. The mask material may be a resist or hard mask material.

After the varying lengths of the horizontal conductors 240a-240d and the insulation layers 260a-260e are defined in the mask materials, etching may be performed to form the electrical connection area 298 as illustrated. Modifications, additions, or omissions may be made to the without departing from the scope of the present disclosure.

FIG. 3 is a schematic, perspective view of a portion of resistive change element array 300 arranged in accordance with at least one embodiment described in the present disclosure. As illustrated in FIG. 3, the resistive change element array 300 is a three-dimensional array formed on a substrate 302. The resistive change element array 300 may illustrate a variation of the resistive change element array 100 of FIG. 1A. Thus, various elements of the resistive change element array 300 may be analogous to the resistive change element array 100 of FIG. 1A and these analogous elements may not be discussed in detail with respect to FIG. 3.

In some embodiments, the resistive change element array 300 may be formed from resistive change element blocks, such as a first resistive change element block 310 and a second resistive change element block 320 illustrated in FIG. 3. For ease of explanation, only the structure of the second resistive change element block 320 is described with respect to FIG. 3. The second resistive change element block 320 may include multiple resistive change element stacks, including a first resistive change element stack 322. The multiple resistive change element stacks including the first resistive change element stack 322 may have analogous construction. For ease of explanation, only the structure of the first resistive change element stack 322 is described with respect to FIG. 3.

In some embodiments, the first resistive change element stack 322 may include a first set of resistive change elements 352 and a second set of resistive change elements 354. Alternately or additionally, the first resistive change element stack 322 may include a vertical conductor 330. A selector material 334 may surround the vertical conductor 330. For example, the vertical conductor 330 may include one or more sidewalls that are substantially perpendicular to a surface of the substrate 202 directly below the resistive change element array 300. In these and other embodiments, the selector material 334 may be adjacent to the sidewalls of the vertical conductor 330. Alternately or additionally, the selector material 334 may be in direct contact with the sidewalls of the vertical conductor 330.

In some embodiments, the selector material 334 may be directly between the vertical conductor 330 and the first set of resistive change elements 352 and the second set of resistive change elements 354. The selector material 334 may be configured such that the vertical conductor 330 maintains in electrical communication with the first set of resistive change elements 352 and the second set of resistive change elements 354. For example, the selector material 334 may be a bidirectional selector material such as a tunnel oxide material or a chalcogenide phase change material. Examples of the tunnel oxide material may include silicon dioxide ($SiO_2$) and Titanium Oxide (TiOx). In some embodiments, the chalcogenide phase change material may include Ovonic Threshold Switch (OTS) characteristics.

In some embodiments, the selector material 334 may reduce electrical current leakage between the vertical conductor 330 and one or more of the resistive change elements of first resistive change element stack 322. Alternately or additionally, the selector material 334 may help to improve write disturb immunity of one or more of the resistive change elements of the first resistive change element stack 322.

Modifications, additions, or omissions may be made to the resistive change element array 300 without departing from the scope of the present disclosure. For example, in some embodiments, the selector material 334 may be between the vertical conductor 330 and the substrate 302.

Figure 4A:
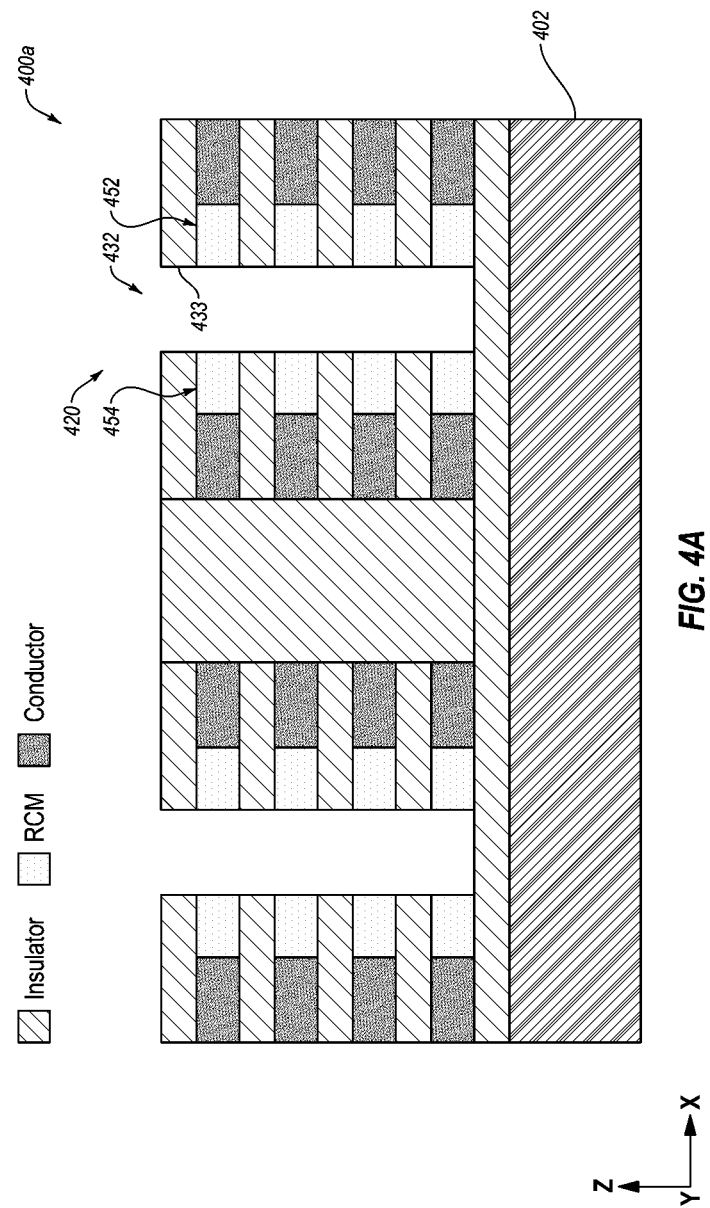
FIG. 4A is a cross-sectional view of openings in alternating layers of insulating material and resistive change material during fabrication of a resistive change element array.
Figure 4B:
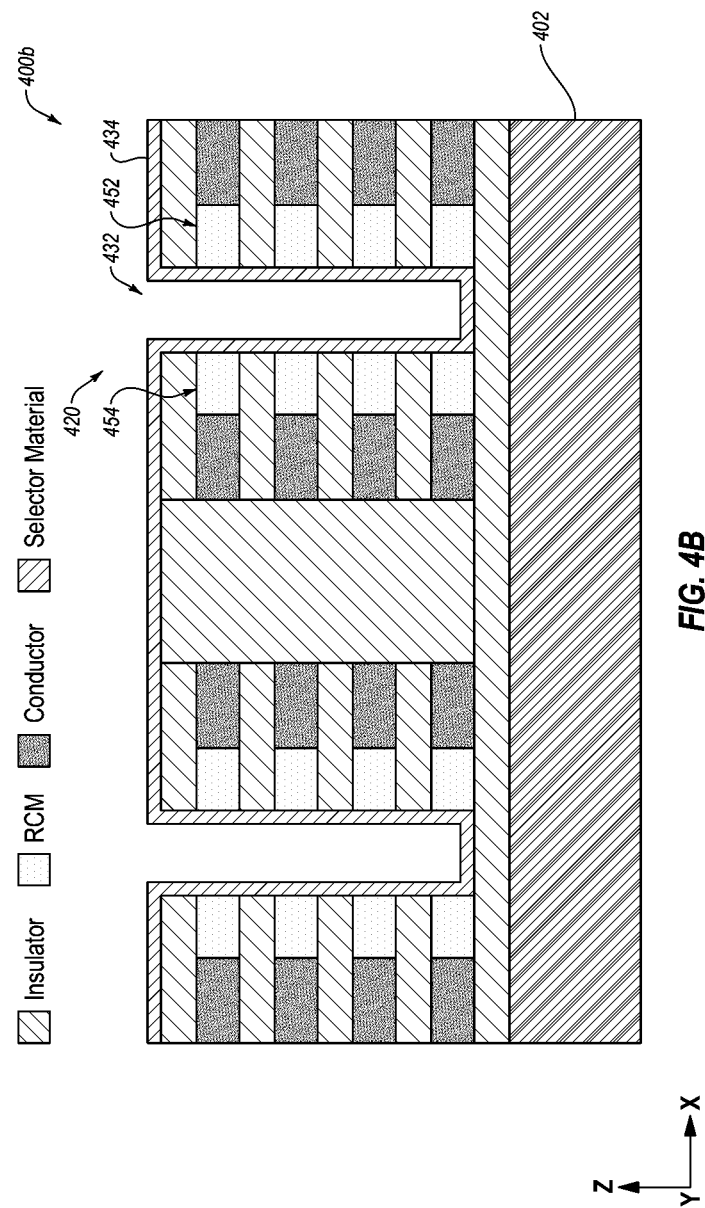
FIG. 4B is a cross-sectional view of a selector material in an opening in alternating layers of insulating material and resistive change material during fabrication of a resistive change element array.
Figure 4C:
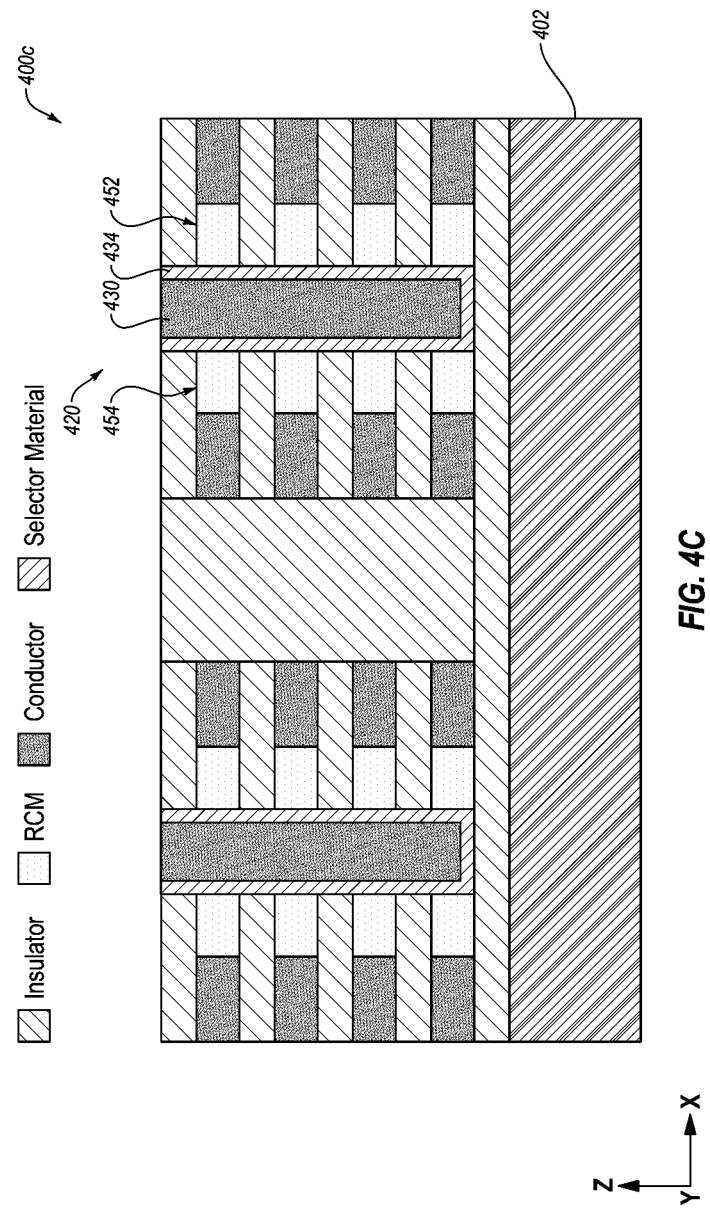
FIG. 4C is a cross-sectional view of vertical conductors during fabrication of a resistive change element array.

FIGS. 4A-4C illustrate various stages of a resistive change element array during an example method to fabricate the resistive change element array. For example, FIG. 4A is a cross-sectional view following openings in alternating layers of insulating material and resistive change material during fabrication of a resistive change element array 400a arranged in accordance with at least one embodiment described in the present disclosure. The cross-sectional view may be of a XZ plane of the resistive change element array 400a.

In some embodiments, the resistive change element array 400a may be analogous to the resistive change element array 200i of FIG. 2i. As such, fabrication steps prior to the realization of the structure of FIG. 4A (described in detail in the forgoing discussion of previous figures) are not shown for sake of clarity and ease of explanation. In these and other embodiments, the resistive change element array 400a may include a substrate 402 and a resistive change element block 420. The resistive change element block 420 may include a first set of resistive change elements 452 and a second set of resistive change elements 454. As illustrated in the resistive change element array 400a, the resistive change element block 420 may have an opening 432 formed therein. The opening 432 may include a sidewall 433. The opening 432 may be analogous to one of the openings 232 of the resistive change element array 200i of FIG. 2i. Modifications, additions, or omissions may be made to the resistive change element array 400a without departing from the scope of the present disclosure.

FIG. 4B is a cross-sectional view of a resistive change element array after the deposition of a selector material arranged in accordance with at least one embodiment described in the present disclosure. The cross-sectional view may be of a XZ plane of the resistive change element array 400b. The resistive change element array 400b illustrates a selector material 434 formed in the opening 432.

The selector material 434 may be deposited over the resistive change element array 400b such that the selector material 434 is deposited in the opening 432. The selector material 434 may be deposited on the sidewalls 433 of the opening 432 and the bottom of the opening 432 and other exposed surfaces.

In some embodiments, the selector material 434 may be in electrical communication and direct contact with the first set of resistive change elements 452 and the second set of resistive change elements 454. The selector material 434 may be a bidirectional selector material. Modifications, additions, or omissions may be made to the resistive change element array 400b without departing from the scope of the present disclosure.

FIG. 4C is a cross-sectional view after forming vertical conductors during fabrication of a resistive change element array 400c arranged in accordance with at least one embodiment described in the present disclosure. The cross-sectional view may be of a XZ plane of the resistive change element array 400c. The resistive change element array 400c may illustrate a vertical conductor 430 formed in the opening 432. The vertical conductor 430 may be formed of a conductor material and may be analogous to the vertical conductors 230 of FIG. 2J.

The vertical conductor 430 may be in electrical communication and direct contact with the selector material 434. As a result, the vertical conductor 430 may be in electrical communication with the first set of resistive change elements 452 and the second set of resistive change elements 454 through the selector material 434.

The formation of the resistive change element array 400c may include a planarization process that may remove the bidirectional selector material and conductor material deposited outside the opening 432 to result in the resistive change element array 400c. The planarization may be chemical-mechanical planarization (CMP) or another type of planarization technique.

Modifications, additions, or omissions may be made to the resistive change element array 400c without departing from the scope of the present disclosure. For example, more than one conductive material may be used to form the vertical conductor 430. For example, a first conductive material may be deposited followed by the deposition of a second conductive material to form the vertical conductor 430.

FIG. 5 is a schematic, perspective view of another resistive change element array 500 arranged in accordance with at least one embodiment described in the present disclosure. As illustrated in FIG. 5, the resistive change element array 500 is a three-dimensional array formed on a substrate 502. The resistive change element array 500 may illustrate a variation of the resistive change element array 100 of FIG. 1A and the resistive change element array 300 of FIG. 3. Thus, various elements of the resistive change element array 300 may be analogous to the resistive change element array 100 of FIG. 1A and the resistive change element array 300 of FIG. 3 and these analogous elements may not be discussed in detail with respect to FIG. 5.

In some embodiments, the resistive change element array 500 may be formed from resistive change element blocks, such as a first resistive change element block 510 and a second resistive change element block 520 illustrated in FIG. 5. For ease of explanation, only the structure of the second resistive change element block 520 is described with respect to FIG. 5. The second resistive change element block 520 may include multiple resistive change element stacks, including a first resistive change element stack 522. The multiple resistive change element stacks including the first resistive change element stack 522 may have analogous construction. For ease of explanation, only the structure of the first resistive change element stack 522 is described with respect to FIG. 5.

In some embodiments, the first resistive change element stack 522 may include a first set of resistive change elements 552 and a second set of resistive change elements 554. Alternately or additionally, the first resistive change element stack 522 may include a vertical conductor 530. A selector material 534 may surround the vertical conductor 530 as described with respect to the selector material 334 of FIG. 3.

In some embodiments, the first resistive change element stack 522 may further include a set of first electrodes 536 and a set of second electrodes 538. In some embodiments, the set of first electrodes 536 may be between the selector material 534 and the first set of resistive change elements 552. For example, each one of the set of first electrodes 536 may be between one of the first set of resistive change elements 552 and the selector material 534. In some embodiments, the set of first electrodes 536 may be in electrical communication and direct contact with the first set of resistive change elements 552. Alternately or additionally, the set of first electrodes 536 may be in electrical communication and direct contact with the selector material 534.

In some embodiments, the set of second electrodes 538 may be between the selector material 534 and the second set of resistive change elements 554. For example, each of the set of second electrodes 538 may be between one of the second set of resistive change elements 554 and the selector material 534. In some embodiments, the set of second electrodes 538 may be in electrical communication and direct contact with the second set of resistive change elements 554. Alternately or additionally, the set of second electrodes 538 may be in electrical communication and direct contact with the selector material 534.

In some embodiments, the set of first electrodes 536 and the set of second electrodes 538 may be formed from a conductor material. For example, the conductor material may be a metal or a metal composite such as titanium nitride TiN, Tantalum nitride TaN, Tungsten W, Cobalt C, or some combination thereof.

In some embodiments, when an electrical current and/or voltage is applied to the first set of resistive change elements 552, the set of first electrodes 536 may act as electrodes on a first side of the first set of resistive change elements 552. In these and other embodiments, the electrical current and/or voltage may be coupled to the set of first electrodes 536 by way of the vertical conductor 530.

Modifications, additions, or omissions may be made to the resistive change element array 500 without departing from the scope of the present disclosure. For example, in some embodiments, the selector material 534 may be between the vertical conductor 530 and the substrate 502.

Figure 6A:
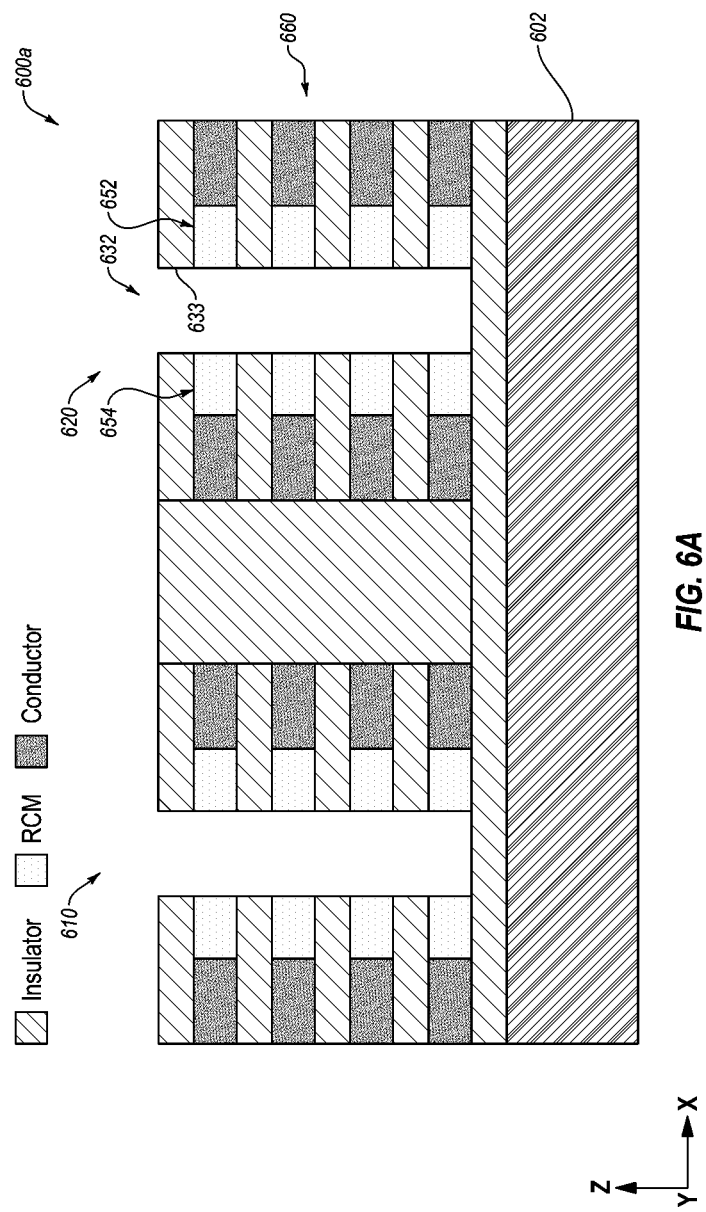
FIG. 6A is a cross-sectional view of openings in alternating layers of insulating material and resistive change material during fabrication of a resistive change element array.

FIGS. 6A-6D illustrate various stages of a resistive change element array during an example method to fabricate the resistive change element array. For example, FIG. 6A is a cross-sectional view after trenches are formed in alternating layers of insulating material and resistive change material during fabrication of a resistive change element array 600a arranged in accordance with at least one embodiment described in the present disclosure. The cross-sectional view may be of a XZ plane of the resistive change element array 600a.

In some embodiments, the resistive change element array 600a may be analogous to the resistive change element array 200i of FIG. 2i and the resistive change element array 400a of FIG. 4. In these and other embodiments, the resistive change element array 600a may include a substrate 602 and a resistive change element block 620. The resistive change element block 620 may include a first set of resistive change elements 652 and a second set of resistive change elements 654 that are separated by insulator layers 660. As illustrated in the resistive change element array 600a, the resistive change element block 620 may have an opening 632 formed therein. The opening 632 may include a sidewall 633. The opening 632 may be analogous to one of the openings 232 of the resistive change element array 200i of FIG. 2i. Modifications, additions, or omissions may be made to the resistive change element array 600a without departing from the scope of the present disclosure.

Figure 6B:
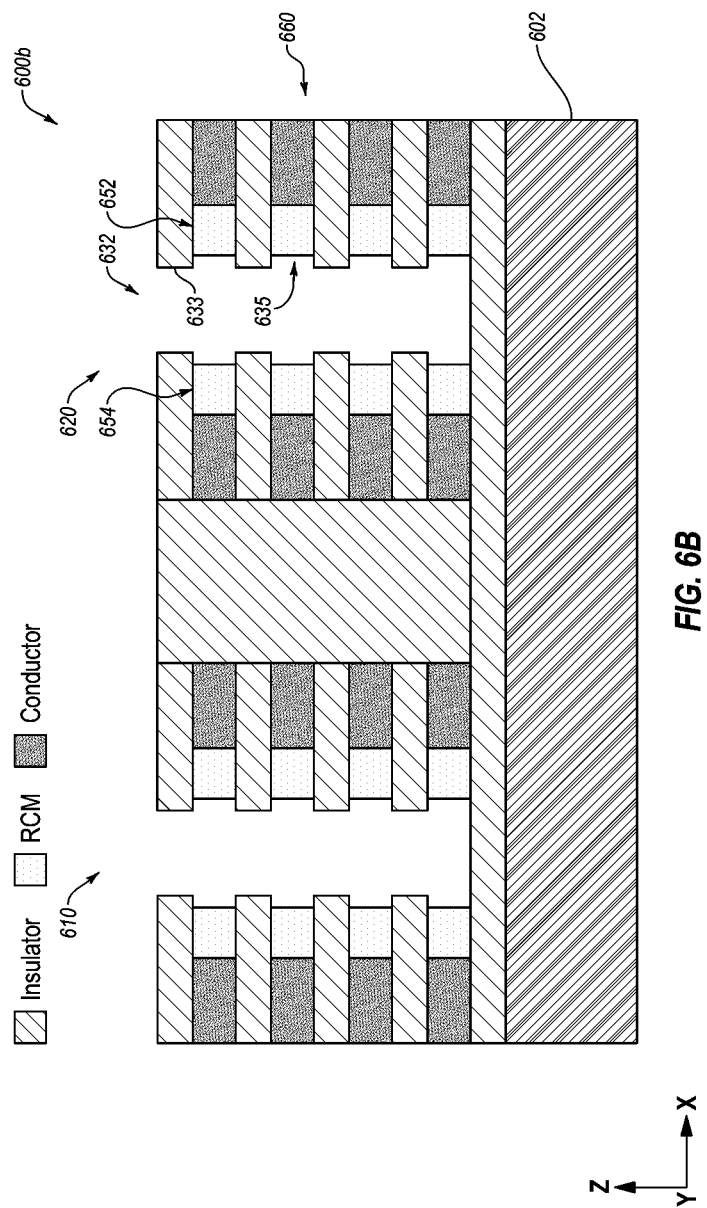
FIG. 6B is a cross-sectional view of etched resistive change material during fabrication of a resistive change element array.

FIG. 6B is a cross-sectional view showing etched resistive change material during fabrication of a resistive change element array 600b arranged in accordance with at least one embodiment described in the present disclosure. The cross-sectional view may be of a XZ plane of the resistive change element array 600b.

The resistive change element array 600b illustrates cavities 635 formed in the sidewall 633 of the opening 632. In some embodiments, the cavities 635 may be formed by etching of the resistive change elements of the first set of resistive change elements 652 and the second set of resistive change elements 654. For example, the first set of resistive change elements 652 may be chemically etched to recess the first set of resistive change elements 652 away from the sidewall 633. The chemical etchant may be selected such that the chemical etchant selectively etches the first set of resistive change elements 652 and does not etch the insulator layers 660.

In some embodiments, the etching that may be performed may be an isotropic etch. For example, the first set of resistive change elements 652 may be isotropically etched using a plasma. For example, an oxygen plasma. In these and other embodiments, the type of chemical or plasma that may be used to etch the first set of resistive change elements 652 may be based on a material used to form the first set of resistive change elements 652.

An amount of etching of the first set of resistive change elements 652 may be controlled based on an amount of time that the etching process is performed. An amount of time for etching may be based on one or more factors: as such conditions for plasma and a flow rate of a material used in the plasma, such as oxygen, among other factors. Modifications, additions, or omissions may be made to the resistive change element array 600b without departing from the scope of the present disclosure.

Figure 6C:
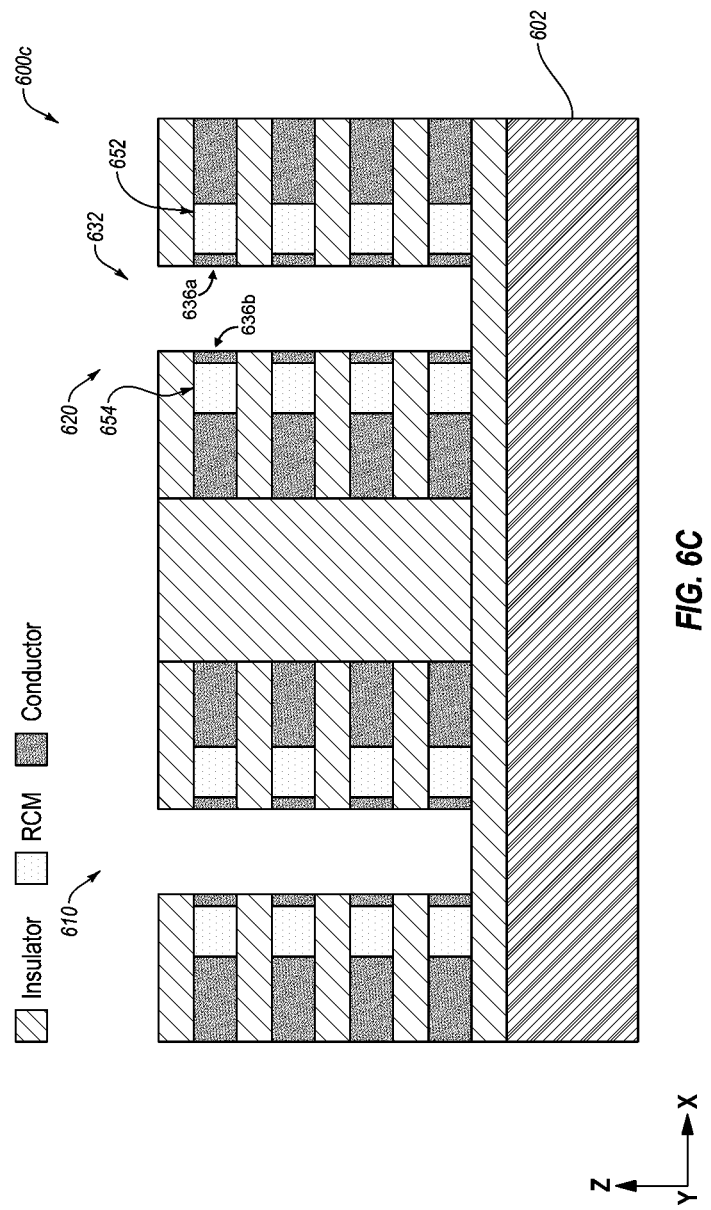
FIG. 6C is a cross-sectional view of electrode conductors during fabrication of a resistive change element array.

FIG. 6C is a cross-sectional view after electrode conductors are formed during fabrication of a resistive change element array 600c arranged in accordance with at least one embodiment described in the present disclosure. The cross-sectional view may be of a XZ plane of the resistive change element array 600c. The resistive change element array 600c illustrates a set of first electrodes 636a and a set of second electrodes 636b, collectively the electrodes 636, that are formed in the cavities 635 in the sidewall 633 of the opening 632. The set of first electrodes 636a may be in electrical communication and direct contact with the first set of resistive change elements 652. The set of second electrodes 636b may be in electrical communication and direct contact with the second set of resistive change elements 654.

In some embodiments, the electrodes 636 may be formed of a conductive material, such as titanium nitride TiN, Tantalum nitride TaN, Tungsten W, Cobalt C, and other conductive materials. The deposition process to form the electrodes 636 may be performed by CVD, PECVD, or ALD, among other deposition processes. The thickness of the electrodes 636 may be selected such that the electrodes 636 completely fill the cavities 635.

In some embodiments, during the formation of the electrodes 636, the conductive material may be deposited in the opening 632 to extend past the sidewall 633 of the opening 632 and over the resistive change element array 600c. In these and other embodiments, the conductive material may be etched to remove the conductive material outside of the cavities 635 in the sidewall 633 such that the electrodes 636 form a planar surface with the sidewall 633 of the opening 632.

Modifications, additions, or omissions may be made to the resistive change element array 600c without departing from the scope of the present disclosure. For example, in some embodiments, the electrodes 636 may be formed by more than one conductive material. For example, a first conductive material may be deposited followed by the deposition of a second conductive material to form the electrodes 636.

Figure 6D:
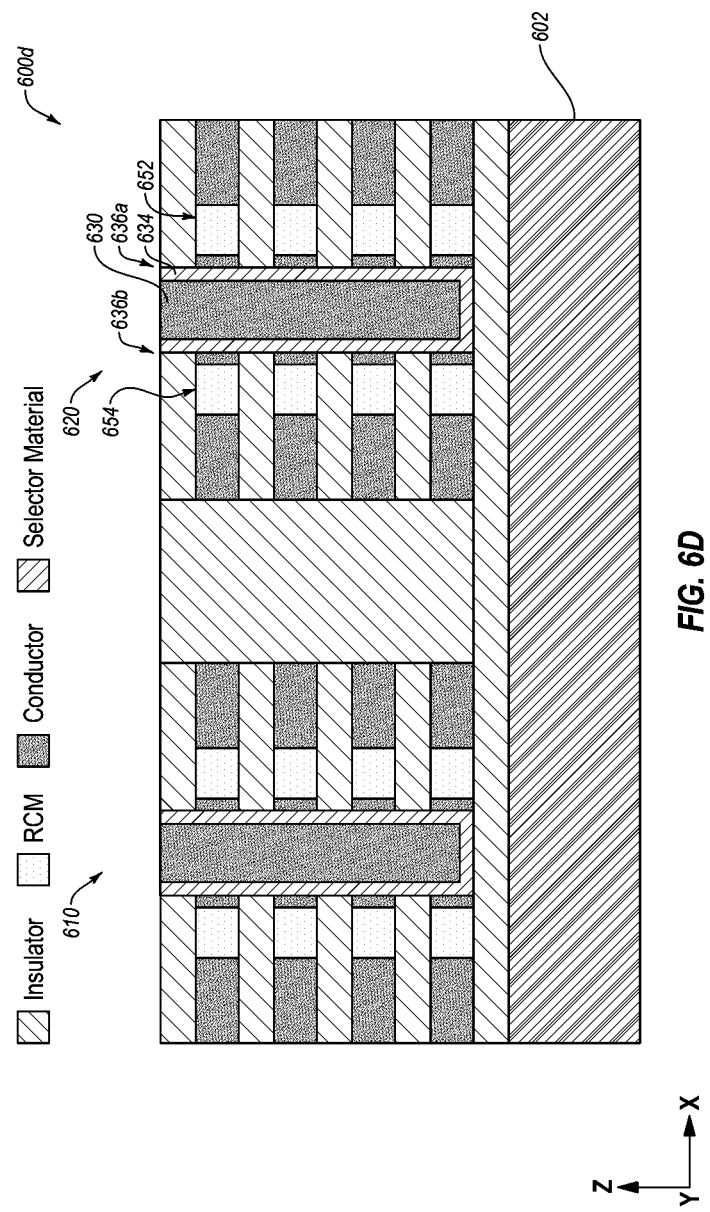
FIG. 6D is a cross-sectional view of vertical conductors during fabrication of a resistive change element array.

FIG. 6D is a cross-sectional view after selector materials and vertical conductors are deposited during fabrication of a resistive change element array 600d arranged in accordance with at least one embodiment described in the present disclosure. The cross-sectional view may be of a XZ plane of the resistive change element array 600d. The resistive change element array 600d may illustrate a selector material 634 and a vertical conductor 630 formed in the opening 632.

The selector material 634 may be deposited in a process analogous to the formation of the selector material 434 as described with respect to FIG. 4B. The vertical conductor 630 may be deposited in a process analogous to the formation of the vertical conductor 430 as described with respect to FIG. 4B. In these and other embodiments, the selector material 634 may be formed such that the selector material 634 is in electrical communication and direct contact with the electrodes 636. Modifications, additions, or omissions may be made to the resistive change element array 600d without departing from the scope of the present disclosure.

Figure 7:
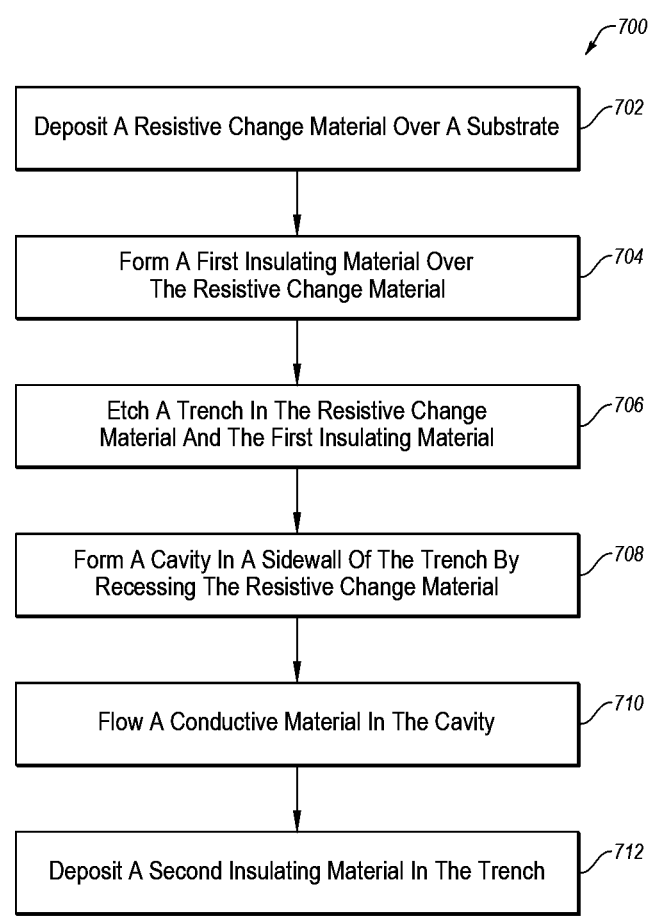
FIG. 7 is a flowchart of an example method to fabricate a resistive change element array.

FIG. 7 is a flowchart of an example method 700 to fabricate a resistive change element array. The method 700 may be arranged in accordance with at least one embodiment described in the present disclosure. Although illustrated as discrete blocks, various blocks may be divided into additional blocks, combined into fewer blocks, or eliminated, depending on the desired implementation.

The method 700 may begin at block 702, where a resistive change material may be deposited over a substrate. The resistive change material may be a nanotube fabric and the depositing the resistive change material may be performed by a spin coating operation.

At block 704, a first insulating material may be formed over the resistive change material. At block 706, a trench may be etched in the resistive change material and the first insulating material.

At block 708, a cavity may be formed in a sidewall of the trench by recessing the resistive change material. At block 710, a conductive material may be flowed in the cavity. At block 712, a second insulating material may be deposited in the trench.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 700 may further include etching a second trench in the resistive change material and the first insulating material and depositing a third insulating material in the second trench. In some embodiments, the recessing the resistive change material may result in the resistive change material being divided into first and second portions separated by the third insulating material. Alternately or additionally, the conductive material in the cavity may contact the first and second portions of the resistive change material.

Alternately or additionally, the method 700 may further include forming an opening in the resistive change material and the first insulating material. In these and other embodiments, the opening may be positioned such that the conductive material in the cavity and the first portion of the resistive change material are between the trench and the opening. In some embodiments, the method 700 may further include flowing a second conductive material in the opening. In these and other embodiments, the second conductive material may be configured as an electrical contact for the first portion of the resistive change material and insulated from the second portion of the resistive change material. In some embodiments, the conductive material in the cavity may be configured as an electrical contact for the first and second portions of the resistive change material.

Alternately or additionally, the method 700 may further include depositing a second resistive change material over the first insulating material. In some embodiments, the second resistive change material may be insulated from the conductive material by the first insulating material and the second conductive material may be configured as an electrical contact for the second resistive change material. In these and other embodiments, before depositing the second insulating material the method 700 may further include forming a second cavity in the sidewall of the trench by recessing the second resistive change material and flowing a third conductive material in the second cavity. In these and other embodiments, the forming the second cavity and the forming the cavity are performed by a single chemical etching step and the flowing the conductive material and the depositing the third conductive material may be performed by a single deposition step such that the conductive material and the third conductive material are the same conductive material.

Alternately or additionally, the method 700 may further include forming a second opening in the resistive change material and the first insulating material. In these and other embodiments, the second opening may be positioned such that the conductive material in the cavity and the second portion of the resistive change material are between the trench and the second opening. In some embodiments, the method 700 may further include flowing a third conductive material in the opening. In these and other embodiments, the third conductive material may be configured as an electrical contact for the second portion of the resistive change material and insulated from the first portion of the resistive change material. In these and other embodiments, the second conductive material and the third conductive material may be the same conductive material and the depositing of the second conductive material and the third conductive material may occur during a single deposition of the same conductive material.

As another example, in some embodiments, the method 700 may further include forming an opening in the resistive change material and the first insulating material. In some embodiments, the opening may be positioned such that the conductive material in the cavity is between the trench and opening. In some embodiments, the method 700 may further include flowing a second conductive material in the opening. In these and other embodiments, recessing the resistive change material may result in the resistive change material occupying less than one-half of a space between the second insulating material and the second conductive material in a plane that includes the resistive change material, the conductive material, and the second conductive material.

Alternately or additionally, the method 700 may further include forming a second cavity in a sidewall of the opening by recessing the resistive change material by way of the opening, flowing a third conductive material in the opening, and after flowing the third conductive material, depositing a selector material in the opening, the selector material deposited before the second conductive material.

Figure 8:
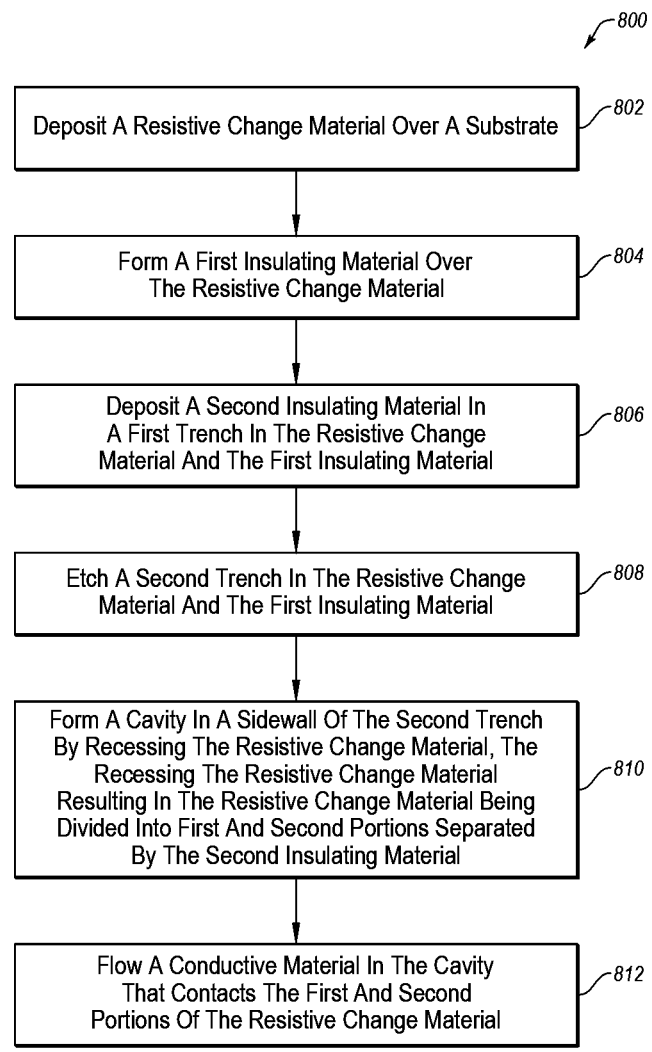
FIG. 8 is a flowchart of another example method to fabricate a resistive change element array.

FIG. 8 is a flowchart of another example method 800 to fabricate a resistive change element array. The method 800 may be arranged in accordance with at least one embodiment described in the present disclosure. Although illustrated as discrete blocks, various blocks may be divided into additional blocks, combined into fewer blocks, or eliminated, depending on the desired implementation.

The method 800 may begin at block 802, where a resistive change material may be deposited over a substrate. In some embodiments, the resistive change material may be a nanotube fabric and the depositing the resistive change material may be performed by a spin coating operation.

At block 804, a first insulating material may be formed over the resistive change material. At block 806, a second insulating material may be deposited in a first trench in the resistive change material and the first insulating material.

At block 808, a second trench may be etched in the resistive change material and the first insulating material. At block 810, a cavity may be formed in a sidewall of the second trench by recessing the resistive change material. In some embodiments, the recessing the resistive change material may result in the resistive change material being divided into first and second portions separated by the second insulating material. In these and other embodiments, recessing the resistive change material may also result in the resistive change material occupying less than one-half of a space between the second insulating material and the second conductive material in a plane that includes the resistive change material, the conductive material, and the second conductive material.

At block 812, a conductive material may be flowed in the cavity that contacts the first and second portions of the resistive change material.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 800 may further include forming an opening in the resistive change material and the first insulating material. In some embodiments, the opening may be positioned such that the conductive material in the cavity and the first portion of the resistive change material are between the second trench and the opening. In these and other embodiments, the method 800 may further include flowing a second conductive material in the opening. In these and other embodiments, the second conductive material may be configured as an electrical contact for the first portion of the resistive change material and insulated from the second portion of the resistive change material. In these and other embodiments, the conductive material in the cavity may be configured as an electrical contact for the first and second portions of the resistive change material.

Alternately or additionally, the method 800 may further include depositing a second resistive change material over the first insulating material. In these and other embodiments, the second resistive change material may be insulated from the conductive material by the first insulating material and the second conductive material may be configured as an electrical contact for the second resistive change material.

Alternately or additionally, the method 800 may further include forming a second cavity in the sidewall of the second trench by recessing the second resistive change material and flowing a third conductive material in the second cavity. In these and other embodiments, the forming the second cavity and the forming the cavity may be performed by a single chemical etching step and the flowing the conductive material and the depositing the third conductive material may be performed by a single deposition step such that the conductive material and the third conductive material are the same conductive material.

Alternately or additionally, in some embodiments, the method 800 may further include forming a second opening in the resistive change material and the first insulating material. In some embodiments, the second opening may be positioned such that the conductive material in the cavity and the second portion of the resistive change material may be between the second trench and the second opening. In these and other embodiments, the method 800 may further include flowing a third conductive material in the second opening. In some embodiments, the third conductive material may be configured as an electrical contact for the second portion of the resistive change material and insulated from the first portion of the resistive change material. In these and other embodiments, the second conductive material and the third conductive material may be the same conductive material and the flowing of the second conductive material and the third conductive material may occur during a single deposition of the same conductive material.

Alternately or additionally, in some embodiments, the method 800 may further include forming a second cavity in a sidewall of the opening by recessing the resistive change material by way of the opening, flowing a third conductive material in the opening, and after flowing the third conductive material, depositing a selector material in the opening. In some embodiments, the selector material may be deposited before the second conductive material.

Figure 9A:
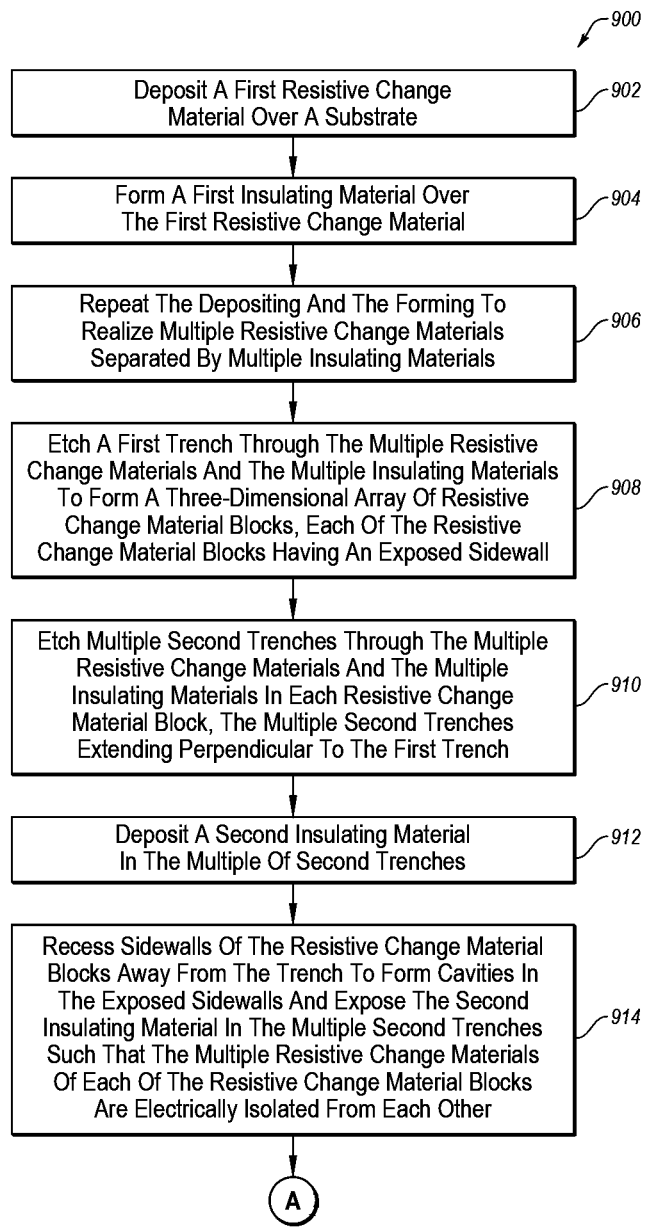
FIGS. 9A and 9B include a flowchart of another example method to fabricate a resistive change element array.
Figure 9B:
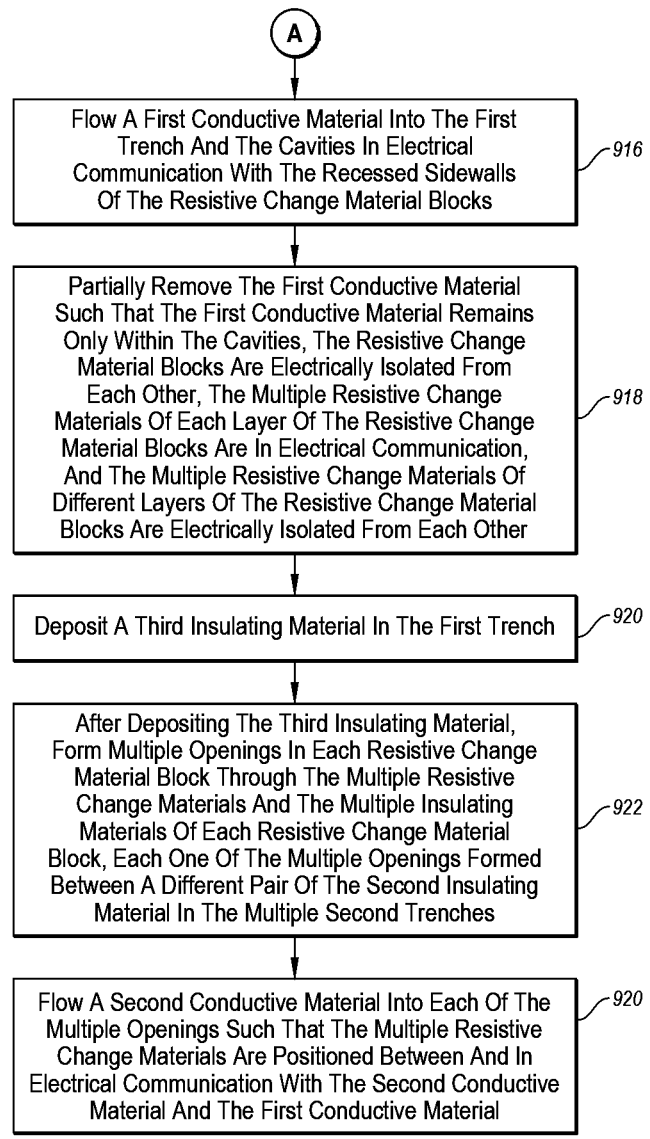

FIGS. 9A and 9B include a flowchart of an example method 900 to fabricate a resistive change element array. The method 900 may be arranged in accordance with at least one embodiment described in the present disclosure. Although illustrated as discrete blocks, various blocks may be divided into additional blocks, combined into fewer blocks, or eliminated, depending on the desired implementation.

The method 900 may begin at block 902, where a first resistive change material may be deposited over a substrate. At block 904, a first insulating material may be formed over the first resistive change material. At block 906, the depositing and the forming may be repeated to realize multiple resistive change materials separated by multiple insulating materials.

At block 908, a first trench may be etched through the multiple resistive change materials and the multiple insulating materials to form a three-dimensional array of resistive change material blocks. In these and other embodiments, each of the resistive change material blocks may have an exposed sidewall.

At block 910, multiple second trenches may be etched through the multiple resistive change materials and the multiple insulating materials in each resistive change material block. In some embodiments, the multiple second trenches may extend perpendicular to the first trench. At block 912, a second insulating material may be deposited in the multiple second trenches.

At block 914, sidewalls of the resistive change material blocks may be recessed away from the trench to form cavities in the exposed sidewalls and expose the second insulating material in the multiple second trenches such that the multiple resistive change materials of each of the resistive change material blocks are electrically isolated from each other.

At block 916, a first conductive material may be flowed into the first trench and the cavities in electrical communication with the recessed sidewalls of the resistive change material blocks.

At block 918, the first conductive material may be partially removed such that the first conductive material remains only within the cavities. In these and other embodiments, the resistive change material blocks may be electrically isolated from each other, the multiple resistive change materials of each layer of the resistive change material blocks may be in electrical communication, and the multiple resistive change materials of different layers of the resistive change material blocks may be electrically isolated from each other.

At block 920, a third insulating material may be deposited in the first trench. At block 922, after depositing the third insulating material, multiple openings may be formed in each resistive change material block through the multiple resistive change materials and the multiple insulating materials of each resistive change material block. In some embodiments, each one of the multiple openings may be formed between a different pair of the second insulating material in the multiple second trenches.

At block 924, a second conductive material may be flowed into each of the multiple openings such that the multiple resistive change materials are positioned between and in electrical communication with the second conductive material and the first conductive material.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

Figure 10:
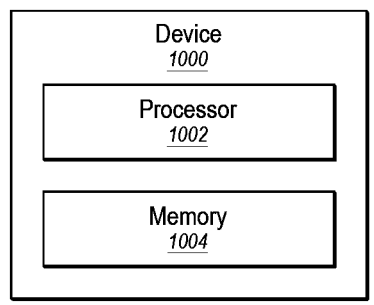
FIG. 10 illustrates an example system that may use a resistive change element array.

FIG. 10 illustrates an example system 1000 that may use a resistive change element array as described in this disclosure. The system 1000 may include a processor 1002 and memory 1004. The system 1000 may be any type of system or device, such as a desktop, laptop, cellphone, smart phone, smart watch, wearable device, server, automobile, airplane, drone, appliance, television, sound system, monitoring system, among any other system or device that uses a processor and memory.

Generally, the processor 1002 may include any suitable special-purpose or general-purpose computer, computing entity, or processing device including various computer hardware or software modules and may be configured to execute instructions stored on any applicable computer-readable storage media. For example, the processor 1002 may include a microprocessor, a microcontroller, a digital signal processor (DSP), an application-specific integrated circuit (ASIC), a Field-Programmable Gate Array (FPGA), graphics processing unit (GPU), vector or array processor, a SIMD (single instruction multiple data) or other parallel processor, or any other digital or analog circuitry configured to interpret and/or to execute program instructions and/or to process data.

Although illustrated as a single processor in FIG. 10, it is understood that the processor 1002 may include any number of processors distributed across any number of networks or physical locations that are configured to perform individually or collectively any number of operations described herein. In some embodiments, the processor 1002 may interpret and/or execute program instructions and/or process data stored in the memory 1004. In some embodiments, the processor 1002 may execute the program instructions stored in the memory 1004. The memory 1004 may include a resistive change element array as illustrated in FIGS. 1-6.

For clarity, technical material that is known in the technical fields related to the examples has not been described in detail to avoid unnecessarily obscuring the description. The described fabrication techniques may be varied and are not limited to the examples provided.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A method to fabricate a resistive change element array, said method comprising:
    depositing a resistive change material over a substrate;
    forming a first insulating material over said resistive change material;
    depositing a second insulating material in a first trench in said resistive change material and said first insulating material;
    etching a second trench in said resistive change material and said first insulating material;
    forming a cavity in a sidewall of said second trench by recessing said resistive change material, said recessing said resistive change material resulting in said resistive change material being divided into first and second portions separated by said second insulating material; and
    flowing a conductive material in said cavity that contacts said first and second portions of said resistive change material.

2. The method of claim 1, further comprising:
    forming an opening in said resistive change material and said first insulating material, said opening positioned such that said conductive material in said cavity and said first portion of said resistive change material are between said second trench and said opening; and
    flowing a second conductive material in said opening, said second conductive material configured as an electrical contact for said first portion of said resistive change material and insulated from said second portion of said resistive change material.

3. The method of claim 2, wherein said conductive material in said cavity is configured as an electrical contact for said first and second portions of said resistive change material.

4. The method of claim 2, further comprising depositing a second resistive change material over said first insulating material, said second resistive change material being insulated from said conductive material by said first insulating material and said second conductive material configured as an electrical contact for said second resistive change material.

5. The method of claim 4, further comprising:
    forming a second cavity in said sidewall of said second trench by recessing said second resistive change material; and
    flowing a third conductive material in said second cavity.

6. The method of claim 5, wherein said forming said second cavity and said forming said cavity are performed by a single chemical etching step and said flowing said conductive material and said depositing said third conductive material are performed by a single deposition step such that said conductive material and said third conductive material are said same conductive material.

7. The method of claim 2, further comprising:
    forming a second opening in said resistive change material and said first insulating material, said second opening positioned such that said conductive material in said cavity and said second portion of said resistive change material are between said second trench and said second opening; and
    flowing a third conductive material in said second opening, said third conductive material configured as an electrical contact for said second portion of said resistive change material and insulated from said first portion of said resistive change material.

8. The method of claim 7, wherein said second conductive material and said third conductive material are said same conductive material and said flowing of said second conductive material and said third conductive material occurs during a single deposition of said same conductive material.

9. The method of claim 2, wherein recessing said resistive change material results in said resistive change material occupying less than one-half of a space between said second insulating material and said second conductive material in a plane that includes said resistive change material, said conductive material, and said second conductive material.

10. The method of claim 2, further comprising:
    forming a second cavity in a sidewall of said opening by recessing said resistive change material by way of said opening;
    flowing a third conductive material in said opening; and
    after flowing said third conductive material, depositing a selector material in said opening, said selector material deposited before said second conductive material.

11. The method of claim 1 wherein said resistive change material is a nanotube fabric and said depositing said resistive change material is performed by a spin coating operation.

* * * * *